United States Patent [19]
Montreuil

[11] Patent Number: 5,592,513
[45] Date of Patent: Jan. 7, 1997

[54] SYNCHRONOUS MODULATOR AND METHODS FOR SYNCHRONOUS MODULATION

[75] Inventor: Leo Montreuil, Atlanta, Ga.

[73] Assignee: Scientific-Atlanta, Inc., Norcross, Ga.

[21] Appl. No.: 473,949

[22] Filed: Jun. 7, 1995

Related U.S. Application Data

[62] Division of Ser. No. 223,223, Apr. 5, 1994.

[51] Int. Cl.$^6$ .............................. H03C 1/04; H04L 27/36
[52] U.S. Cl. ........................ 375/296; 375/308; 332/103
[58] Field of Search .................................. 375/278–281, 375/284, 296, 308; 332/103; 455/109–110

[56] References Cited

U.S. PATENT DOCUMENTS

| | | | |
|---|---|---|---|
| 3,445,593 | 5/1969 | Gray et al. ........................... | 375/308 X |
| 3,745,255 | 7/1973 | Fletcher et al. ...................... | 329/308 |
| 3,902,018 | 8/1975 | Fockens ............................... | 381/5 |
| 4,085,378 | 4/1978 | Ryan et al. ........................... | 329/308 |
| 4,143,322 | 3/1979 | Shimamura ........................... | 375/327 |
| 4,168,397 | 9/1979 | Bradley ............................... | 375/308 X |
| 4,253,118 | 2/1981 | Flasza ................................. | 348/725 |
| 4,323,924 | 4/1982 | Flasza ................................. | 348/726 |
| 4,339,772 | 7/1982 | Eilers et al. .......................... | 348/485 |
| 4,405,944 | 9/1983 | Eilers et al. .......................... | 348/485 |
| 4,462,001 | 7/1984 | Girard ................................. | 375/284 X |
| 4,490,743 | 12/1984 | Mycynek et al. ...................... | 348/737 |
| 4,602,287 | 7/1986 | Fockens ............................... | 348/737 |
| 4,870,382 | 9/1989 | Keate et al. .......................... | 375/327 |
| 5,040,063 | 8/1991 | Citta et al. ........................... | 348/470 |
| 5,043,812 | 8/1991 | Citta et al. ........................... | 348/470 |
| 5,087,975 | 2/1992 | Citta et al. ........................... | 348/21 |
| 5,111,155 | 5/1992 | Keate et al. .......................... | 375/284 X |
| 5,136,381 | 8/1992 | Citta et al. ........................... | 348/437 |
| 5,138,272 | 8/1992 | Le Polozec et al. ................... | 329/308 |
| 5,144,431 | 9/1992 | Citta et al. ........................... | 348/400 |
| 5,181,112 | 1/1993 | Citta et al. ........................... | 348/470 |
| 5,268,647 | 12/1993 | Ichiyoshi ............................. | 329/307 |
| 5,396,196 | 3/1995 | Blodgett .............................. | 375/284 X |

OTHER PUBLICATIONS

GI, Zenith In Compression Cross–License, *Electronic News*, Feb. 14, 1994.

Digital Grand Alliance Selects Zenith's VSB Over QAM, Technology.

Test of Zenith 16–VSB Transmission System, Cable Television Labs, Alexandria, VA 22314, May 3–5, 1993, by Williams and James.

Practical Implementation of a 43 MBIT/SEC. (8 BIT/HZ) Digital Modem for Cable Television, Zenith Electronics Corp., by Rich Citta and Ron Lee, NCTA 1993, San Francisco, CA.

Data Transmission, McGraw Hill, Bennett & Davey, 1965, Chapter 13.

Technical Details, Digital Spectrum Compatible, Zenith–AT&T, Sep. 23, 1991.

Modulation, *Elements of Transmission Analysis*, pp. 188–203.

Communication Systems, B. P. Lathi, John Wiley & Sons, Inc., 1968, pp. 196–200.

Frequency and Phase Lock Loop, *IEEE Transactions on Consumer Electronics*, vol. CE–23, No. 3, Aug. 1977.

The Digital Spectrum–Compatible HDTV Transmission System, *IEEE Transactions on Consumer Electronics*, vol. 37, No. 3, Aug. 1991, pp. 469–475.

*Primary Examiner*—Young T. Tse
*Attorney, Agent, or Firm*—Banner & Witcoff, Ltd.

[57] ABSTRACT

A synchronous detector has first and second mixer circuits and a voltage controlled oscillator. The voltage controlled oscillator provides a local oscillator signal directly to the second mixer circuit and indirectly to the first mixer circuit through a phase transformer. The output of the first and second mixer circuits are combined in combiner circuitry to produce a jitter cancelled output signal. The jitter cancelled output signal is filtered in a loop filter and applied to the voltage controlled oscillator to control the frequency and phase of the local oscillator signal. The combiner circuitry includes a summer and a jitter cancellation filter. The jitter cancellation filter is preferably a high pass filter matched to spectrum of the signal detected. The output of the first mixer circuit is passed through the high pass filter into one input of the summer while the output of the second mixer circuit is passed to the second input of the summer. The output of the summer is passed to the loop filter.

12 Claims, 25 Drawing Sheets

PHASE PERFORMANCE OF PRIOR ART

SYNCHRONOUS MODULATOR AND METHODS FOR SYNCHRONOUS MODULATION

This application is a division of application Ser. No. 08/223,223, filed Apr. 5, 1994, pending.

BACKGROUND OF THE INVENTION

1. Field of the Invention

The field of the invention relates to synchronous detection of RF signals. In particular, the invention relates to synchronous detectors providing low phase jitter in the detected signal.

2. Description of Related Art

Known synchronous detectors use phase-locked loops to regenerate a replica of the carrier signal for use in synchronous detection. Phase modulation of the pilot carrier is an inherent part of a vestigial sideband signal. When a phase-locked loop is used to synchronously detect a vestigial sideband signal, the phase-locked loop will lock onto the inherent phase modulation of the pilot and produce replica of the carrier signal having inherent phase noise induced thereon. This phase noise will result in a distorted output at the output of the synchronous demodulator. To minimize this phase noise, known phase-locked loops use loop filters with a narrow bandwidth. This limits the phase-locked loop's ability to track phase and maintain phase coherence with the carrier signal when sudden phase shifts are injected into the modulated signal, for example, undesired phase modulation in the local oscillator of the tuner due to microphonic effects.

Synchronous detector technology is an important technology for high definition television, among other uses. The transmission techniques for high definition television is a subject of recent controversy. Some proponents desire QAM while other proponents desire VSR. For example, 16-QAM, quadrature amplitude modulation, is a technique where a sequence of four bit data nibbles are split into two separated sequences of two bit symbols per sequence. The two separated sequences of symbols are fed into the two modulation input ports of a quadrature multiplex type modulator. QAM output signals are double sideband signals where the sidebands bear no particular phase relationship to each other due to the asymmetry between the two separate sequences of symbols used in the modulation process.

In contrast, for example, 4-VSB, vestigial sideband, is a technique where the same sequence of four bit nibbles is constituted as a single sequence of four bit symbols where the VSB symbol rate is equal to the sum of the symbol rates of the two separated sequences of symbols used in QAM.

The digital high definition television Grand Alliance, including AT&T, Zenith, General Instrument Corp., the Massachusetts Institute of Technology, Thomson Consumer Electronics, Philips Consumer Electronics and the David Sarnoff Research Center, has selected VSB over QAM as the transmission technology for high definition television.

The importance of high performance synchronous detection of VSB or QAM signals to high definition television is obvious. However, the present invention has application to any transmission technology where unwanted phase modulation in the transmitted signal induces phase errors in the detected signal.

SUMMARY OF THE INVENTION

It is an object of the present invention to overcome noted limitations in the prior art. It is another object of the present invention to cancel phase noise within the bandwidth of the phase-locked loop used in the synchronous detector. It is yet another object of the invention to improve phase tracking accuracy for any specified loop bandwidth. It is yet another object of the invention to increase loop bandwidth in phase-locked loops for any specified phase tracking accuracy.

These and other objects are achieved in a synchronous detector having first and second mixing circuits and a voltage-controlled oscillator. The voltage-controlled oscillator provides a local oscillator signal to the second mixer circuit directly and to the first mixer circuit indirectly through a phase transformer. The output of the first and second mixer circuits are provided to a combiner circuit to produce a combined output signal. The combined output signal is filtered through a loop filter to provide the control signal for controlling the frequency of the voltage controlled oscillator. The combiner circuitry included a jitter cancellation filter characterized by a transfer function having a change in signal density per unit frequency slope substantially equal to a change in signal density per unit frequency slope of the modulated signal to be detected.

BRIEF DESCRIPTION OF THE DRAWINGS

The invention will be described in detail in the following description of preferred embodiments with reference to the following figures wherein.

DESCRIPTION OF PREFERRED EMBODIMENTS

Figure 1A:
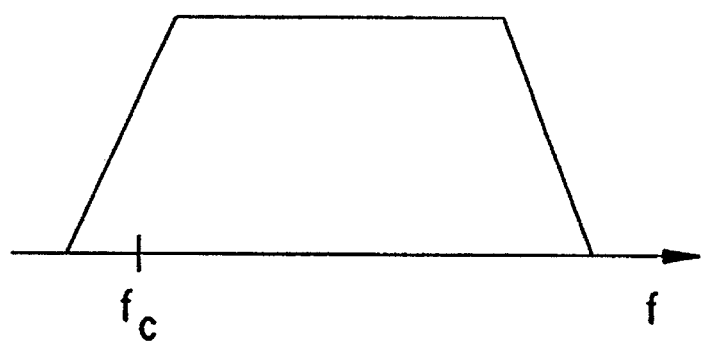
FIG. 1A is a graph showing a signal frequency density spectrum of an information signal.

FIG. 1A is a graph showing a signal frequency density spectrum of an information signal, the information signal shown being a vestigial sideband modulated signal modulated about a carrier frequency $f_c$. Such a signal is characterized as having frequency components at frequencies which are both higher and lower than the carrier frequency. However, FIG. 1A depicts a situation where the carrier signal is absent, the only frequency component at the carrier frequency being part of the information signal.

Figure 1B:
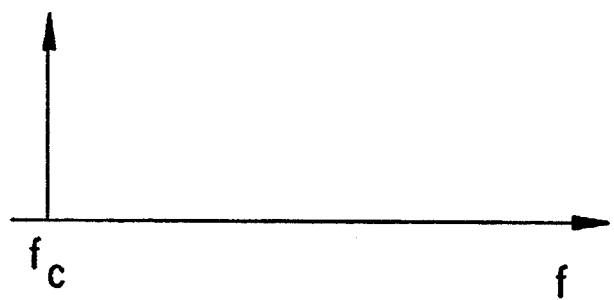
FIG. 1B is a graph showing a signal frequency density spectrum of a narrow band pilot signal.

FIG. 1B is a graph showing a signal frequency density spectrum of a pilot signal to be added to the vestigial sideband signal.

Figure 1C:
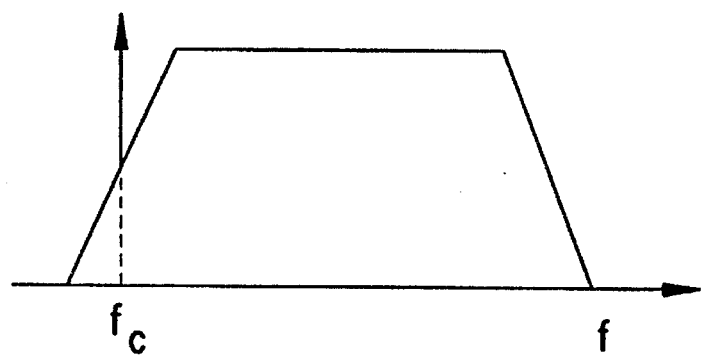
FIG. 1C is a graph showing a signal frequency density spectrum of an information signal containing a pilot signal.

FIG. 1C is a graph showing a signal frequency density spectrum of a combination of the information signal with the pilot signal.

Figure 2:
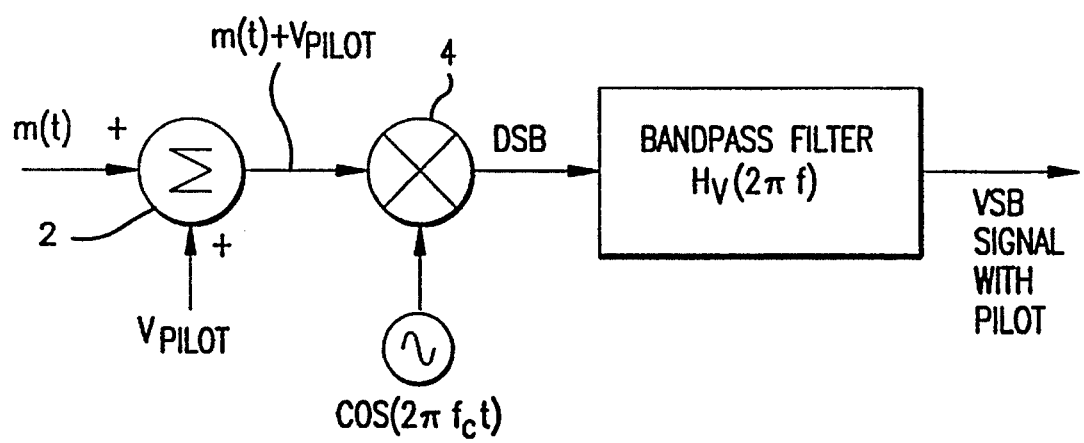
FIG. 2 is a block diagram showing a representative system for generating vestigial sideband modulated signals.

FIG. 2 is a block diagram showing a representative modulator for producing a vestigial sideband signal. The signal to be modulated, m(t), whose Fourier transform is $M(2\pi f)$, is first added at summation circuit 2 to V pilot, where V pilot may be a dc voltage, and then mixed, preferably in a balanced mixer 4, with a carrier signal $\cos(2\pi f_c t)$ to produce a double sideband modulated signal. The double sideband modulated signal is processed through an appropriate filter having transfer function $H_v(2\pi f)$ to produce vestigial sideband modulated signal $\phi_v(t)$ whose Fourier transform is $\Phi_v(2\pi f)$. The signal frequency density spectrum (excluding the pilot) of the modulated signal is given by:

$$\Phi(2\pi f)=0.5[M(2\pi f+2\pi f_c)+M(2\pi f-2\pi f_c)]H(2\pi f). \tag{1}$$

The original signal m(t) is recovered when the vestigial sideband modulated signal $\phi_v(t)$ is processed through a synchronous detector.

Figure 3:
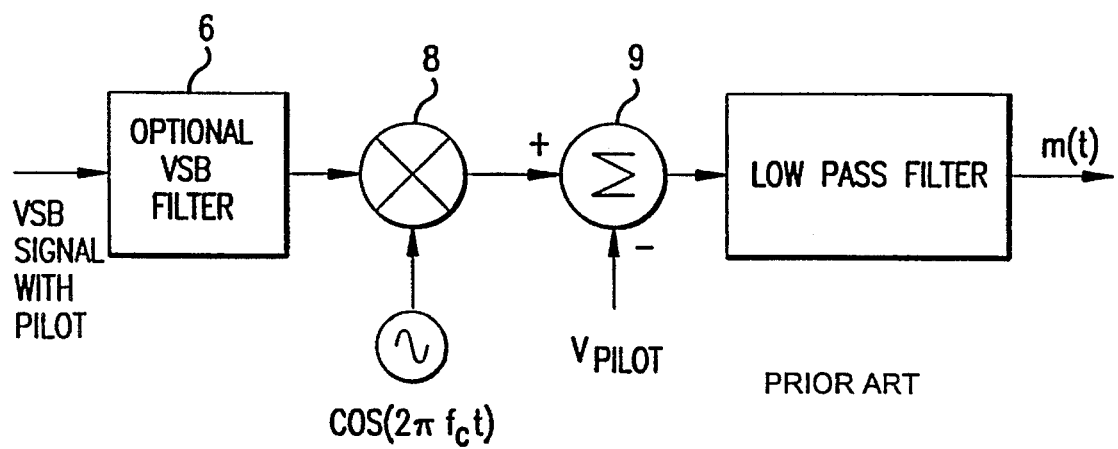
FIG. 3 is a block diagram showing an idealized conventional synchronous detector.

FIG. 3 is a block diagram showing a representative idealized synchronous detector. The vestigial sideband modulated signal 100 $_v(t)$ may be bandpass filtered in filter 6 and then is multiplied by the carrier signal $\cos(2\pi f_c t)$ in mixer 8 to produce a mixed signal e(t) whose Fourier transform, $E(2\pi f)$, is given by:

$$0.25\{H(2\pi f+2\pi f_c)\,[M(2f+4\pi f_c)+M(2\pi f)]+H(2\pi f-2\pi f_c)\,[M(2\pi f-4\pi f_c)+M(2\pi f)]\}. \tag{2}$$

Figure 4A:
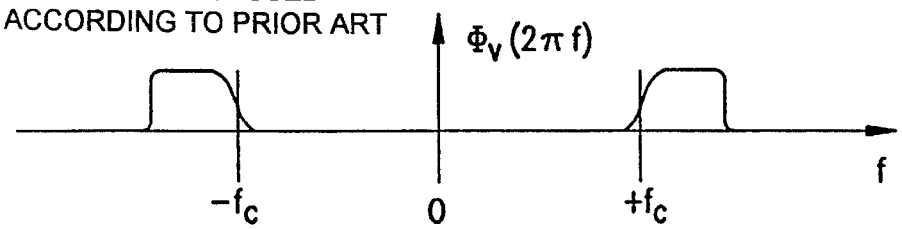
FIGS. 4A–4D are graphs showing signal frequency density spectra of signals processed through the synchronous detector of FIG. 3.
Figure 4B:
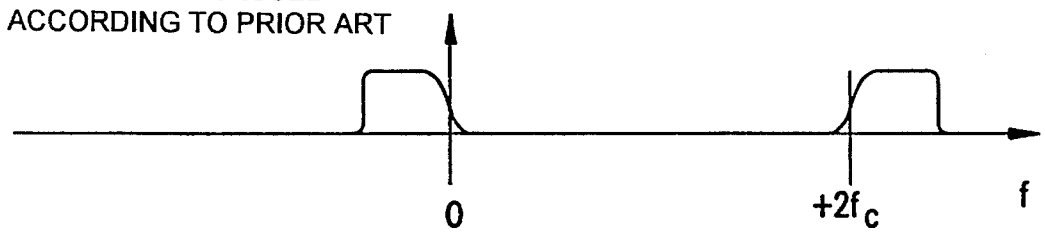
Figure 4C:
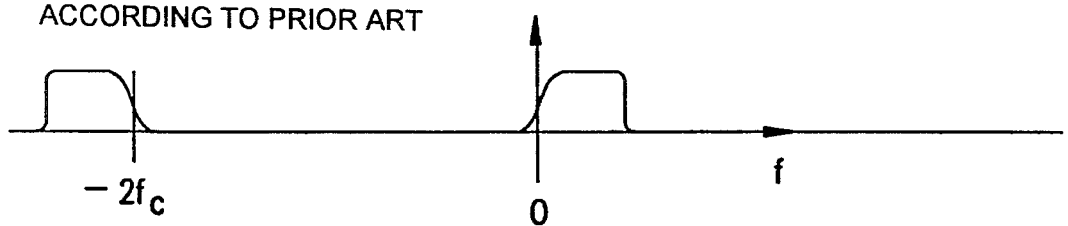

From this signal it may be necessary to remove V pilot added at transmitter (FIG. 2) using adder 9. The signal frequency density spectrum $\Phi_v(2\pi f)$ of the vestigial sideband modulated signal is shown in FIG. 4A. The output $E(2\pi f)$ of the mixer of the synchronous detector shown in FIG. 3 is shown as a signal frequency density spectrum in FIG. 4D. The first line of equation (2), above, corresponds to the signal frequency density spectrum shown in FIG. 4C and the second line of equation (2), above, corresponds to the signal frequency density spectrum shown in FIG. 4B. The output of the mixer, whose Fourier transform is $E(2\pi f)$, is next processed through a low pass filter whose transfer function is shown as dashed lines in FIG. 4D. This removes the high frequency content of the signal which may be present at twice the carrier frequency. The signal frequency density spectrum of the output of the low pass filter is given by:

$$E_O(2\pi f)=0.25M(2\pi f)\,[H(2\pi f+2\pi f_c)+H(2\pi f-2\pi f_c)]. \tag{3}$$

The output of the low pass filter $e_O(t)$ is an exact replica of the modulation signal m(t) when:

$$E_O(2\pi f)=k\,M(2\pi f), \tag{4}$$

where k is a constant. Therefore, when the transfer function of the filter shown in FIG. 2 is characterized by:

$$H(2\pi f+2\pi f_c)+H(2\pi f-2\pi f_c)=4k, \tag{5}$$

then the modulation signal m(t) may be completely recovered.

Figure 5:
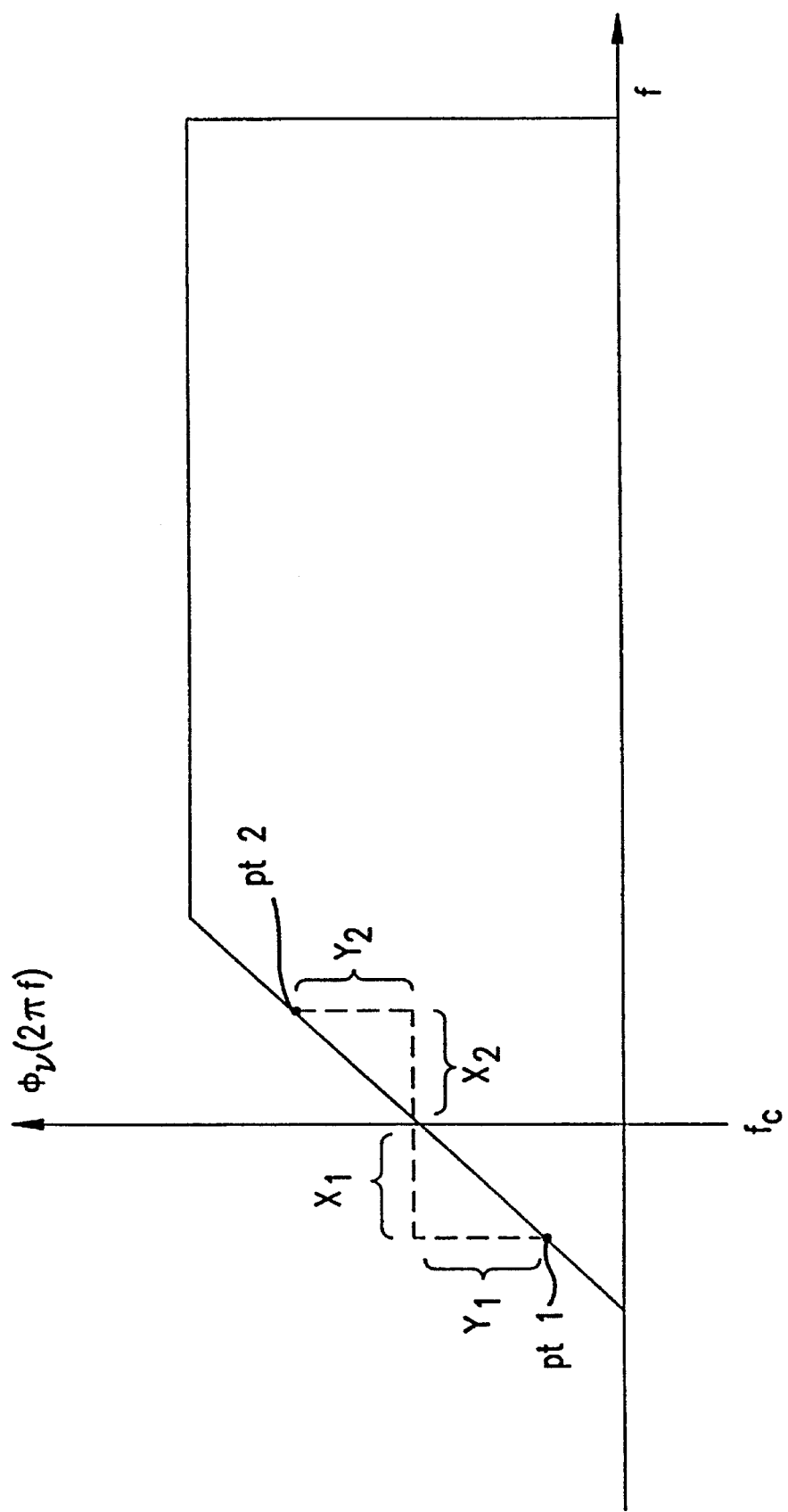
FIG. 5 is a graph showing signal frequency density spectrum properties of the vestigial sideband modulated signal generated in the circuit of FIG. 2.

The condition indicated in equation (5) is best illustrated in FIG. 5. FIG. 5 is a graph showing a signal frequency density spectrum of the vestigial sideband modulated carrier where the carrier frequency is $f_c$. As can be seen from FIG. 5, point 1 is anti-symmetric to point 2 with respect to the carrier frequency $f_c$. Using the frequency density of the signal frequency density spectrum at the carrier frequency $f_c$ as a reference density, the frequency density at point 1 is reduced with respect to the reference density by $y_1$ while the frequency density at point 2 is increased with respect to the reference density by $y_2$. Furthermore, $y_1$ equals $y_2$ when the frequency offset at point 1 (i.e., $x_1$) equals the frequency offset at point 2 (i.e., x2). A signal having a frequency spectrum as shown in FIG. 5 can be demodulated by an ideal synchronous detector to completely recover the modulation signal m(t).

Figure 6A:
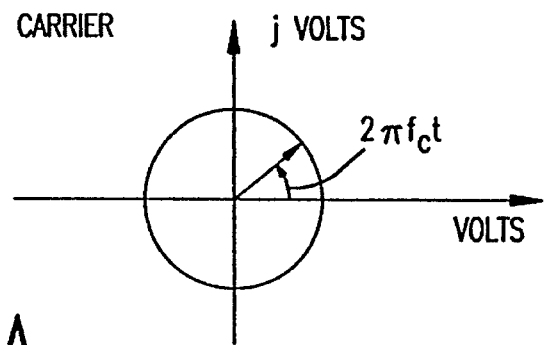
FIGS. 6A–6D are phasor vector graphs showing the phase modulation inherent in the vestigial sideband modulated signal whose frequency density distribution is shown in FIG. 5.
Figure 6B:
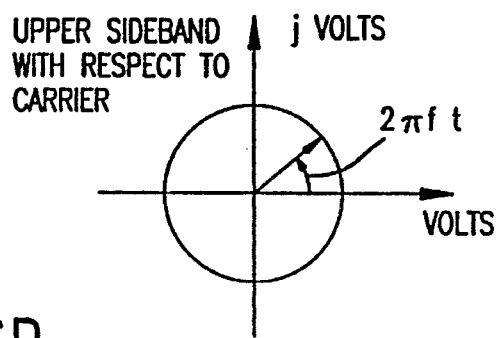
Figure 6C:
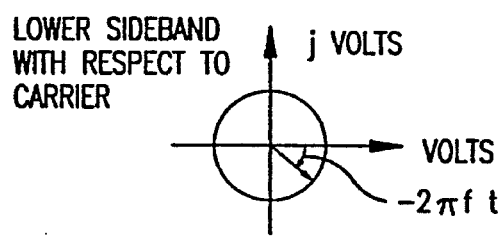

Vestigial sideband modulated signals contain inherent phase modulation. FIG. 6A is a graph showing a phasor vector diagram of the carrier signal. The vector itself rotates counterclockwise in a complex voltage plane. Only the real component of the carrier signal is actually present in the modulation process. The vector rotates counterclockwise in the complex voltage plane at a radian frequency of $2\pi f_c$ so that the real component of the vector is $\cos(2\pi f_c t)$. FIG. 6B is a graph showing the phasor vector for the upper sideband signal with respect to the carrier signal. The phasor vector rotates counterclockwise indicating a positive frequency variance with respect to the carrier frequency. FIG. 6C is a graph showing the phasor vector for the lower sideband signal with respect to the carrier signal. The phasor vector rotates clockwise indicating a negative frequency variance with respect to the carrier frequency. Note that the amplitude of the phasor vector for the lower sideband is less than the amplitude of the phasor vector for the upper sideband since this signal is representative of a vestigial sideband modulated signal. A double sideband modulated carrier would have equal amplitude vectors, one vector for each sideband, which counter-rotate and always produce a real composite vector. However, a vestigial sideband modulated signal produces a phase modulation since the two sideband phasor vectors are unequal. It should be noted here that single sideband modulated signals produced by filtering the output of a balance mixer produces phase modulation. In fact, since infinitely steep cutoff slopes are not possible in real filters, a signal sideband signal produced by filtering would necessarily have a vestige sideband.

Single sideband signals produced by known methods referred to as phasing methods also have some vestige sideband component due to limitations in realization of wide band Hilbert filters. For example, when an audio signal (i.e., 30 to 3840 Hz) is modulated on a carrier using a phasing method, the Hilbert filter is required to produce a 90° phase shift at each frequency within the audio band (e.g., over seven octaves).

Figure 6D:
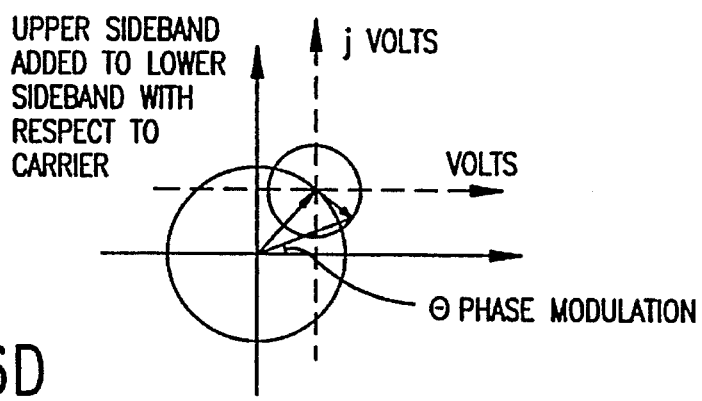

FIG. 6D is a graph showing the upper sideband phasor vector rotating counterclockwise as in FIG. 6B. FIG. 6D also shows, superimposed at the end of the upper sideband phasor vector, a lower sideband phasor vector corresponding to the phasor vector shown in FIG. 6C. There is a residual phase modulation $\ominus$ that remains when the upper and lower sidebands are superimposed. This phase modulation is inherent in the information signal shown in FIG. 1A, and it tends to introduce distortion into the demodulation process in real realizations of synchronous detectors since the real synchronous detectors rely on a pilot signal to regenerate a synchronous replica of the carrier signal.

In U.S. Pat. No. 4,602,287, Pieter Fockens describes a system using a SAW filter to flatten the spectral power of a VSB signal near the carrier frequency to remove the effects of this unwanted residual phase modulation (i.e., phase jitter). This signal with the flattened spectrum is then detected by a convention synchronous detector.

Figure 7:
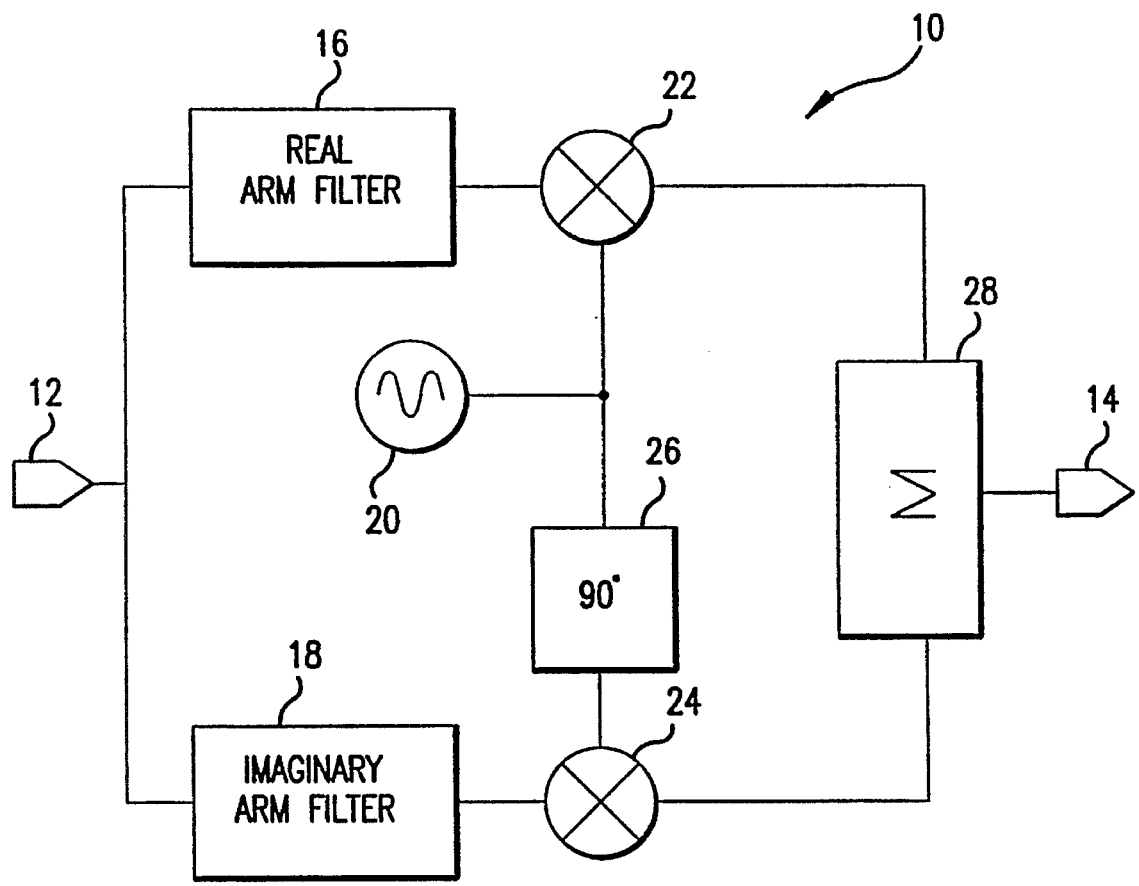
FIG. 7 is a block diagram showing a realization of a synchronous modulator.

A digital implementation of a vestigial sideband modulator is shown in FIG. 7. In a QAM embodiment, FIG. 7 would be modified to show two inputs respectively feeding the imaginary and real arms. In FIG. 7 input data is applied to data input terminal 12 which is turn is provided to an input of real arm 16 of the filter and also to an input of imaginary arm 18 of the filter. Oscillator 20 generates a carrier signal at the carrier frequency. The carrier signal is provided to both balanced modulator 22 and an input of Hilbert filter 26. Since the carrier frequency is substantially spectrally pure, filter 26 is merely a 90° phase shift filter at the carrier frequency. The output of filter 26 is provided to balanced modulator 24. The output of real arm 16 is provided to balanced modulator 22 to modulate the carrier signal. The output of balanced modulator 22 is provided to a first input of summing circuit 28. An output of imaginary arm 18 is provided to balanced modulator 24, and an output of balanced modulator 24 is provided to a second input of summing circuit 28. The output of summing circuit 28 is the modulated carrier signal and is provided at output terminal 14.

The modulator shown in FIG. 7 may produce single sideband modulation signals when imaginary arm 18 is a Hilbert filter to provide a 90° phase shift over the entire bandwidth of the passband of real arm filter 16. When summing circuit 28 adds the signals from balanced modulator 22 and 24, the upper sideband signal is provided at output terminal 14. When summing circuit 28 subtracts the signal from balanced modulator 24 from the signal from balanced modulator 22, the modulated carrier provided at output terminal 14 is the lower sideband signal.

Modulator 10 may also produce a quadrature amplitude modulated (QAM) signal. In this case, as briefly described above, the data input includes two separate data streams feeding imaginary and real arms 16 and 18. The first data stream is provided to real arm filter 16, and the second data stream is provided to imaginary arm filter 18. When both real and imaginary arms 16 and 18 are Nyquist filters, the modulated carrier signal at output terminal 14 is then a quadrature amplitude modulated signal.

Modulator 10 may also produce vestigial sideband modulated signals. Modulator 10 will produce vestigial sideband modulated signals when the weights applied to the real and imaginary arms 16 and 18 are appropriately determined, as discussed in more detail below.

A digital implementation of the real and imaginary arms 16 and 18 of the VSB filter will now be described with reference to FIG. 8. The general form of the transfer function of a discrete time filter in the z-domain is:

$$H(z)=[b(z)]/[a(z)], \tag{6}$$

where b(z) and a(z) are polynomial expressions in z given by:

$$b(z)=b_0 z^0 + b_1 z^{-1} + b_2 z^{-2} + \tag{7}$$

$$a(z)=a_0 z^0 + a_1 z^{-1} + a_2 z^{-2} + \tag{8}$$

where $z^0$ is the present sample, $z^{-1}$ is the next prior sample, and so forth. When it is desired to produce vestigial sideband modulated signals, positions of the poles and zeros of the transfer function of the VSB filter are rotated 45° with respect to positions of the poles and zeros of the transfer function of the Nyquist filter. The transformed transfer function is generally given by:

$$H_t(z)=[b_t(z)]/[a_t(z)], \tag{9}$$

where the subscript t represents a transformed value, and the polynomials $b_t(z)$ and $a_t(z)$ are given by:

$$b_t(z)=b_0 z^0 + b_1 z^{-1} e^{(j\omega)} + b_2 z^{-2} e^{(j2\omega)} \tag{10}$$

$$a_t(z)=a_0 z^0 + a_1 z^{-1} e^{(j\omega)} + a_2 z^{-2} e^{(j2\omega)} \tag{11}$$

The exponential term $e^{(j\omega)}$ is responsible for the phase shift of the transformation which results in the vestigial sideband modulated signal.

Generally speaking the coefficients of the polynomial b(z) are responsible for the zeros in the filter, and the coefficients of the polynomial a(z) are responsible for the poles of the filter.

In the discrete time implementation discussed below, a finite impulse response (FIR) filter is used although other filter designs may be used. There are no poles; there are only zeros. The polynomial $a_i(z)$ is equal to unity. In FIG. 8, a discrete time signal is provided to data input 42 and passed down a tapped delay line comprised of delay elements 46. Outputs from the taps are weighted by an appropriate coefficient (may be a complex number) in weighting elements 48. In the finite impulse response filter 40 shown in FIG. 8, the coefficients are $b_1, b_2, b_3 \ldots b_{N-1}$ and $b_N$. These values correspond to the coefficient values of equation (7). The weighted tapped terms in filter 40 are then summed in adder 50 and the added output is provided at output terminal 44.

Figure 8:
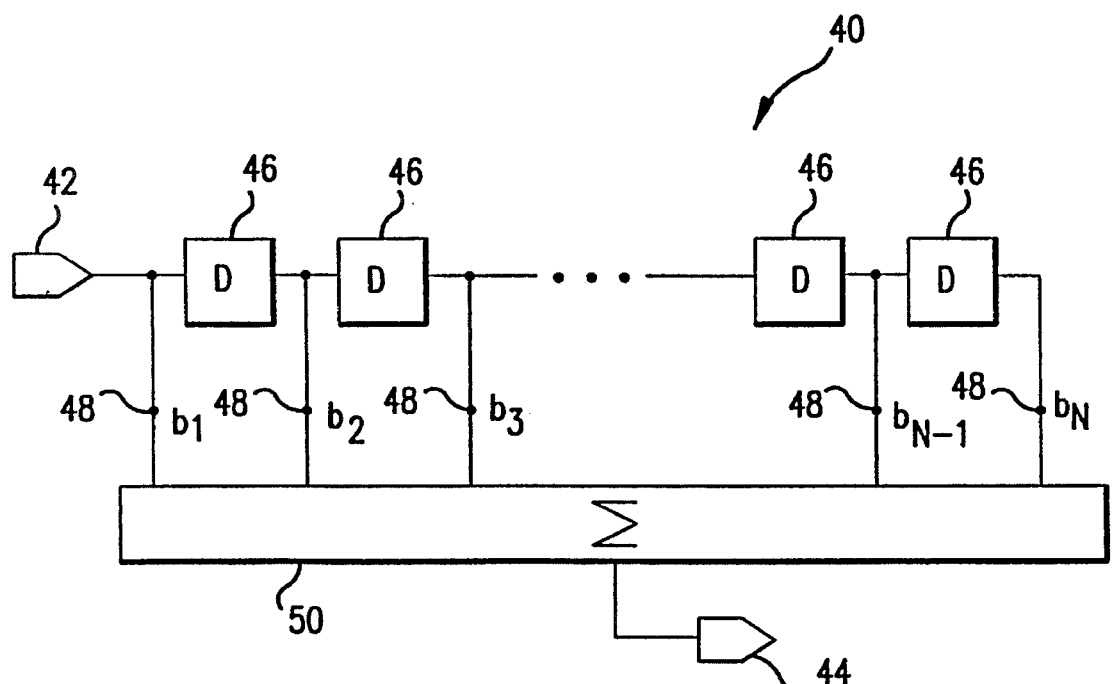
FIG. 8 is a block diagram showing a finite impulse response filter.

Although FIG. 8 depicts a discrete time FIR filter, it is common to implement such discrete time filters as a digital filter where each sampled data input is represented as a digital word (e.g., a 12 or 16 bit word). In such a digital filter, the delay elements 46 may take the forms of clock synchronous registers which are connected in series and "clocked" at an integer multiple of the symbol rate. Furthermore, in such a digital filter, weighting elements 48 may take the form of digital multipliers.

In general, a digital multiplier represented by weighting element 48, is a complex multiplier for multiplying a first complex number (a+jb) by a second complex number (c+jd) as follows:

$$(a+jb)(c+jd)=(ac-bd)+j(ad+bc), \quad (12)$$

so that the general complex multiplier requires four real multipliers and two real adders/subtractors. Note, however, that when the data input to terminal 12 has only a real part (i.e., b=0), the multiplier is simplified. When (a +jb) represents the output of a tap of the tapped delay line and (c+jd) represents the weight to be multiplied by this output, the output of the multiplier is ac+jad since b=0 when the input at terminal 12 has only a real part. The real part of the output of the multiplier is ac, and the imaginary part of the output of the multiplier is ad. On this basis, the general complex filter is separated into real arm 16 for processing the ac terms and imaginary arm 18 for processing the ad terms, both arms being provided with only the real part (i.e., "a") of the digital input data. The real parts of the weights (i.e., "c") are applied to real arm 16, and the imaginary parts of the weights (i.e., "c") are applied to imaginary arm 18.

In the following exemplary embodiment, a Nyquist filter will be described. This filter will be described as a finite impulse response filter such as filter 40 shown in FIG. 8 although an equivalent infinite impulse response filter may be used. Filter 40 is suitable for use as either real arm 16 or imaginary arm 18 shown in FIG. 7 (i.e., all digital values in each filter are real). The filter described is of order 32 (i.e., 33 taps), and the data has a sampling rate of four times the symbol rate. For simplicity the symbol rate will be assumed to be one Hertz; however, it will be obvious that it can be scaled to any particular rate.

Figure 9:
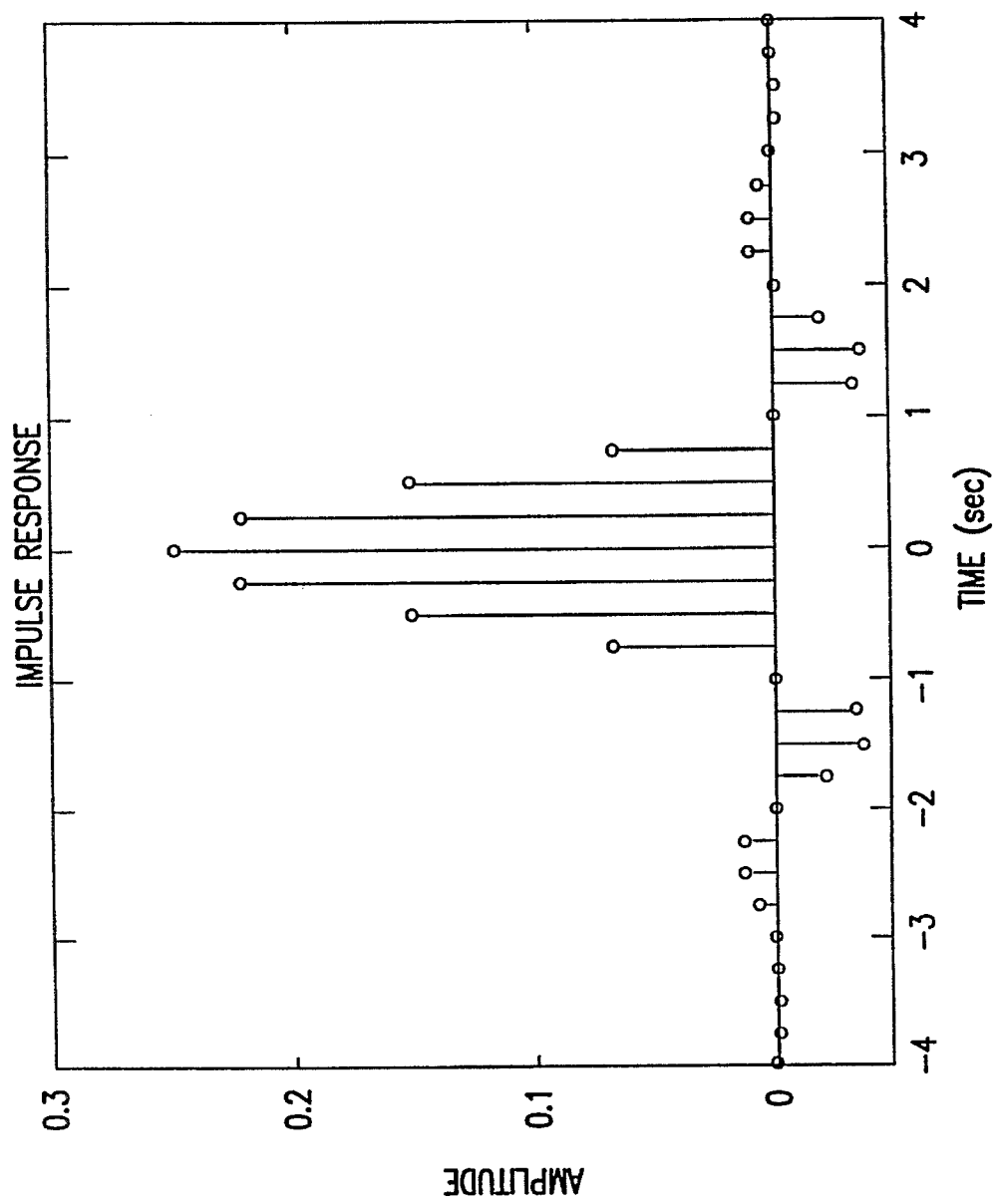
FIG. 9 is a graph showing the impulse response of a Nyquist filter.

The Nyquist filter is designed to have a transfer function corresponding to the impulse response function as shown in FIG. 9. This impulse response has an alpha factor of 50%. That is to say, the bandwidth of the filter exceeds the Nyquist bandwidth by 50%. FIG. 9 shows 33 time samples of the impulse response. These time samples are separated by an element of time corresponding to the time delay inherent in delay elements 46 of filter 40 (i.e., a time delay corresponding to the sampling rate). The amplitude of the impulse response function corresponds to the weights (i.e., $b_1 \ldots b_N$) required to implement the filter whose transfer function is given by equation (6). The values of these coefficients for the Nyquist filter are listed in Table 1 below.

TABLE 1

| ($b_0$ through $b_{32}$) |
|---|
| 0.0000 |
| −0.0008 |
| −0.0018 |
| −0.0021 |
| 0.0001 |
| 0.0051 |
| 0.0102 |
| 0.0101 |
| 0.0000 |
| −0.0190 |
| −0.0361 |
| −0.0346 |
| −0.0001 |
| 0.0682 |
| 0.1527 |
| 0.2229 |
| 0.2501 |
| 0.2229 |
| 0.1527 |
| 0.0682 |
| −0.0001 |
| −0.0346 |
| −0.0361 |
| −0.0190 |
| 0.0000 |
| 0.0101 |
| 0.0102 |
| 0.0051 |
| 0.0001 |
| −0.0021 |
| −0.0018 |
| −0.0008 |
| 0.0000 |

Figure 10:
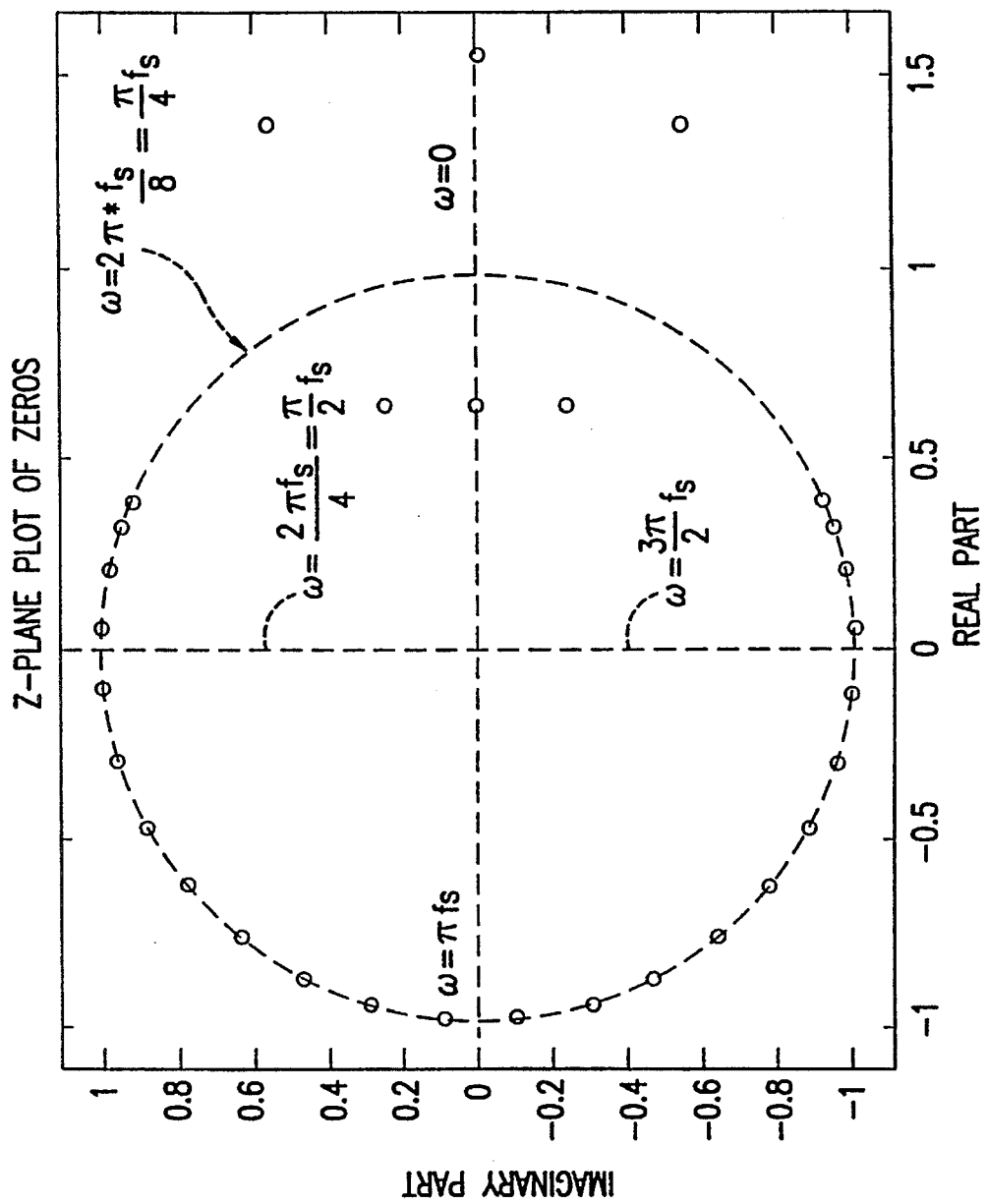
FIG. 10 is a z-domain plot of zeros of an order 32 realization of the Nyquist filter.
Figure 11:
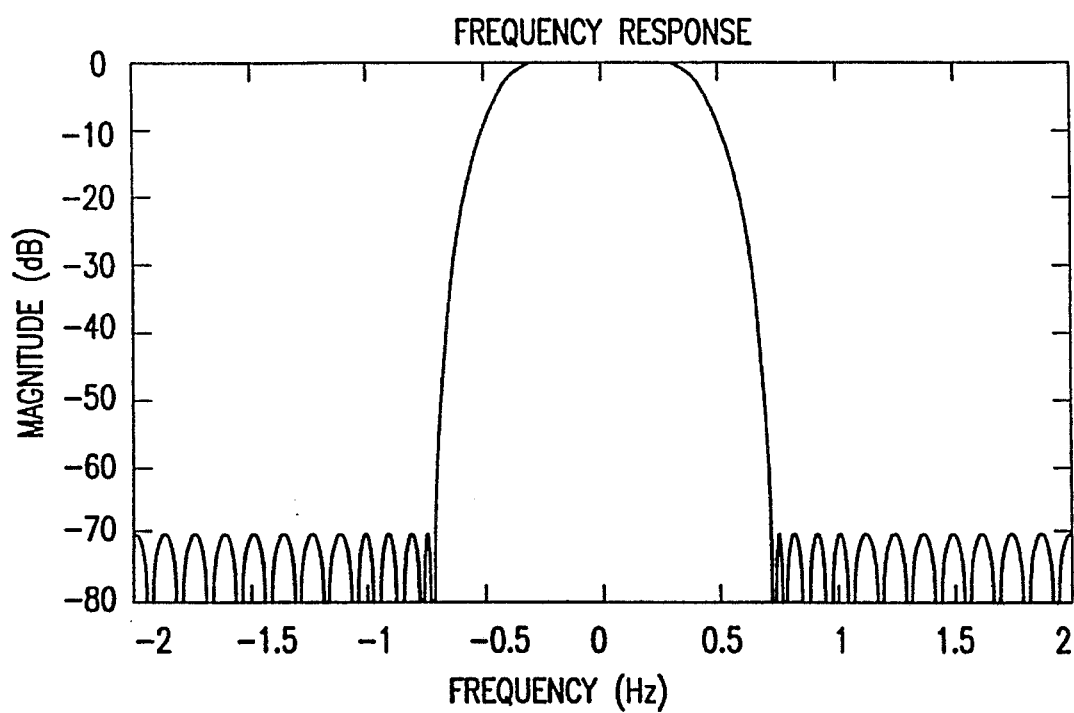
FIG. 11 is a graph showing the frequency response (log magnitude) of the Nyquist filter.
Figure 12:
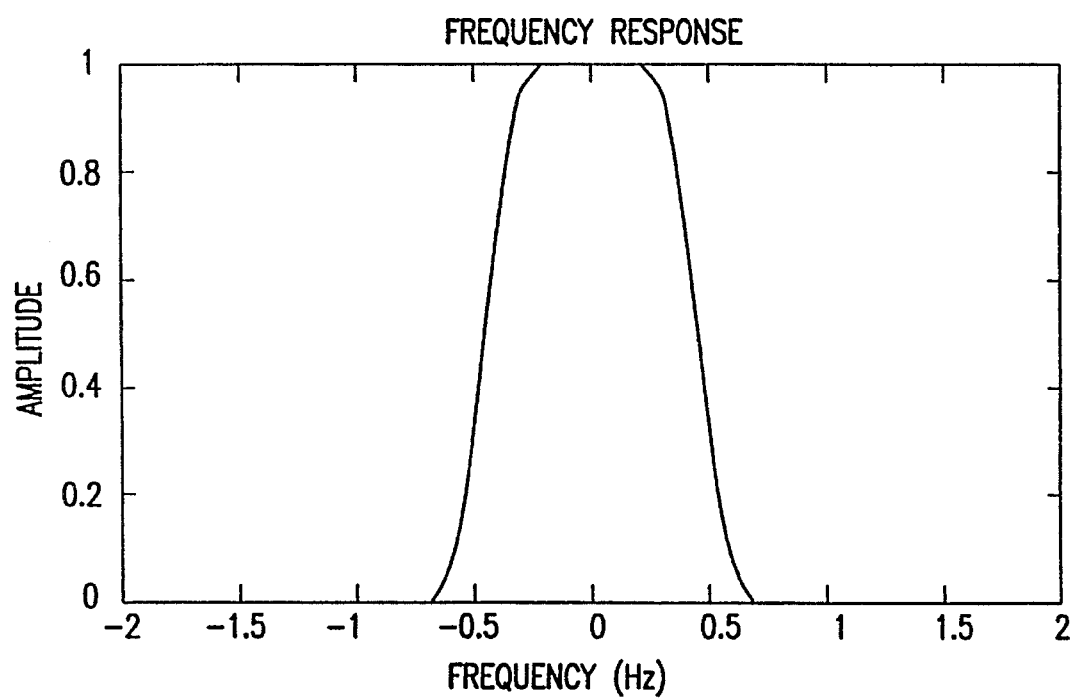
FIG. 12 is a graph showing the frequency response (linear amplitude) of the Nyquist filter.

The zeros of this filter are plotted in the z-domain as shown in the graph of FIG. 10. FIG. 11 is a graph showing the frequency response (as log magnitude) of this filter. FIG. 12 is a graph showing the frequency response (as linear amplitude) of the filter. Note the symmetric shape of the frequency response about zero frequency (which becomes the carrier frequency after the data is modulated on the carrier signal). When both the real and imaginary arms 16 and 18 of FIG. 7 are Nyquist filters as discussed above and each arm of the filter is provided with separate real data streams, a quadrature amplitude modulated (QAM) signal is provided on output terminal 14.

Figure 15:
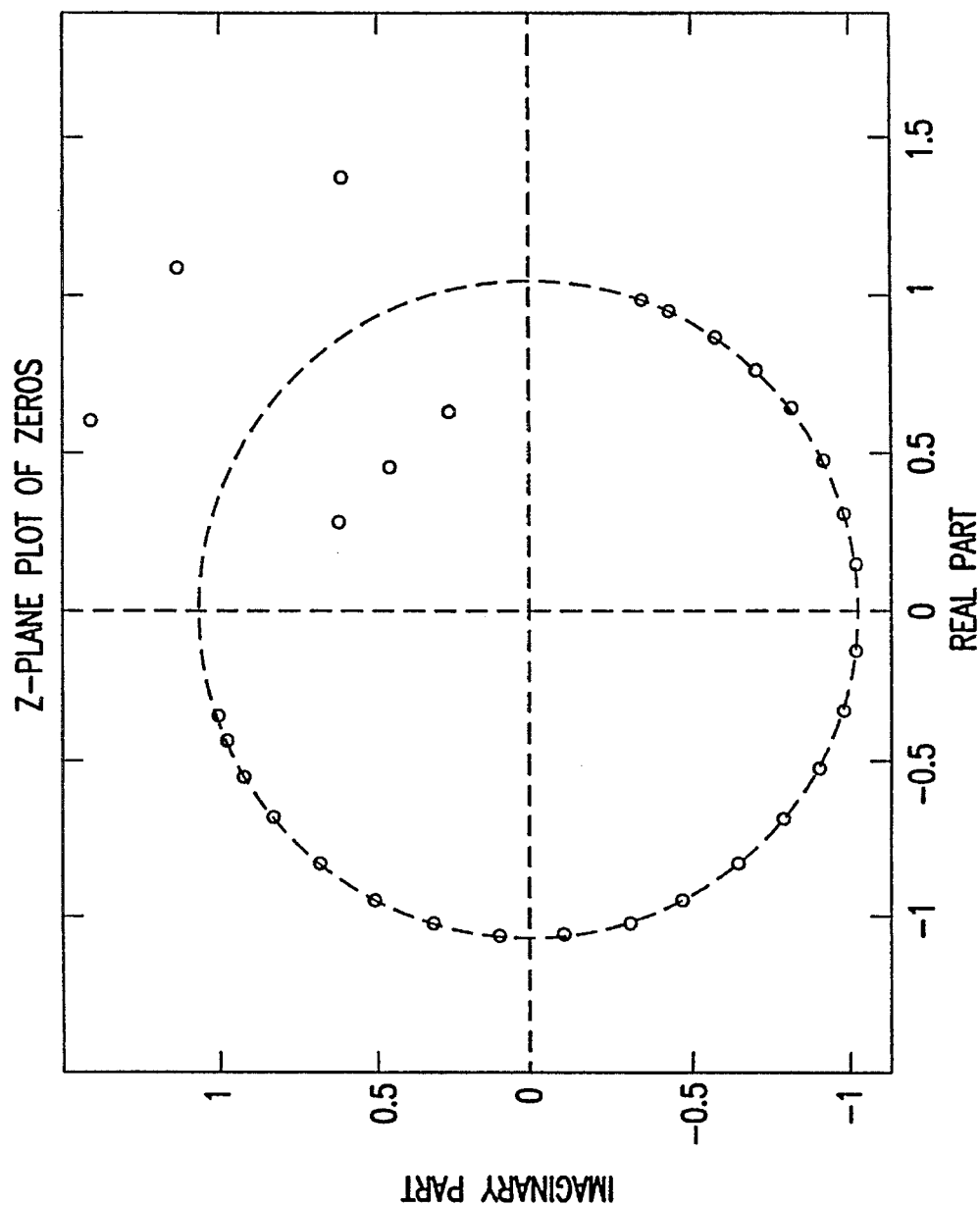
FIG. 15 is a z-domain plot of the zeros of an order 32 realization of the VSB filter.

In order to provide a vestigial sideband (VSB) modulated signal, the poles and zeros of the Nyquist filter as shown in FIG. 10 are then rotated by 45° or π/4 compared with FIG. 15. In the example shown in FIGS. 10 and 11, the sampling frequency of the digital filter is four times the symbol rate (or 4 Hz if the symbol rate is 1 Hz). A frequency translation of 0.5 Hz is then performed to the filter's transfer function. This corresponds to one-eighth of the sampling frequency or 360° divided by 8 which equals 45°.

Equation (10) is used to calculate the weighting coefficients to produce the VSB filter with all poles and zeros rotated 45° with respect to the zeros depicted in FIG. 10. In general, a sequence x[n] may be multiplied, element-by-element, with a corresponding sequence $y[n]=(e\omega)^n$ to obtain a resulting sequence whose Fourier transform is frequency shifted by ω from the Fourier transform of the original sequence x[n]. In this way the poles and zeros of the sequence x[n] are thereby rotated in the z-domain about the origin by angle ω. In the present instance the sequence x[n] corresponds to polynomial b[z] in equations (6) and (7) which is the transfer function of a filter. When the coefficients $b_1 \ldots b_N$ are supplied from Table 1, a Nyquist filter results whose zeros are plotted in FIG. 10. To rotate these zeros by 45°, the values in Table 1 are multiplied, element-by-element, with the sequence $y[n]=(e^\omega)^a$ where ω=45° or π/4. The coefficients of the VSB filter are listed in Table 2.

Figure 13:
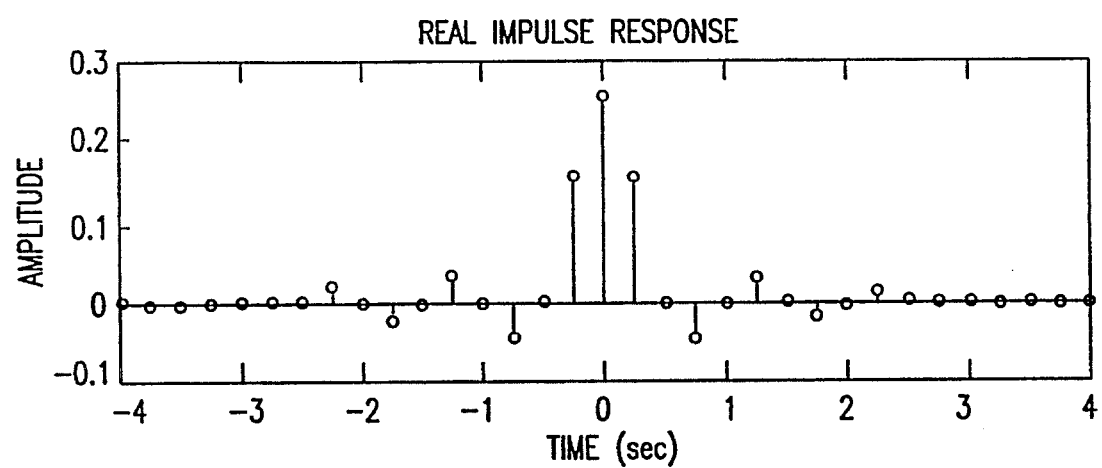
FIG. 13 is a graph showing the impulse response of the real arm of a VSB filter.
Figure 14:
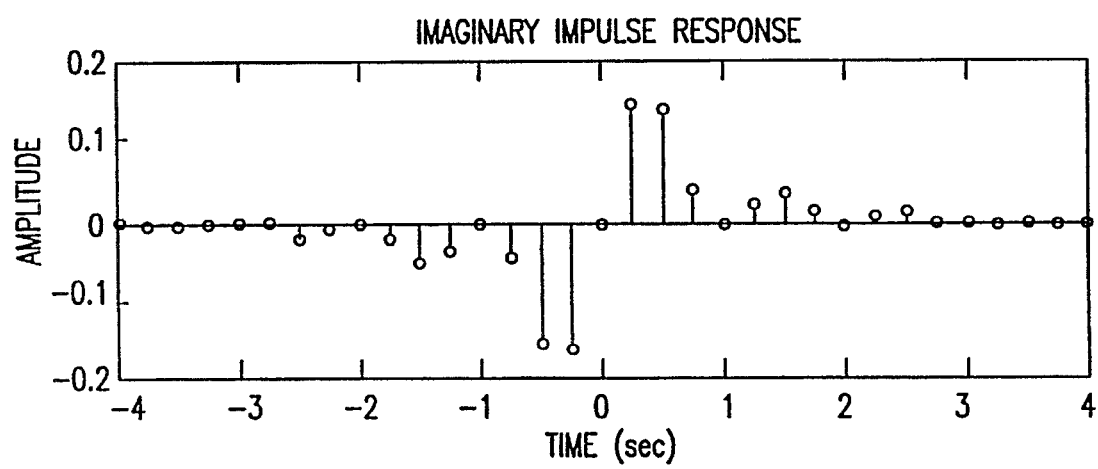
FIG. 14 is a graph showing the impulse response of the imaginary arm of the VSB filter.

As discussed above, the real parts of the resulting coefficients are applied to the corresponding weighting elements in real arm 16 of the VSB filter, and the imaginary parts of the coefficients are applied to the corresponding weighting elements of imaginary arm 18 of the VSB filter. FIGS. 13 and 14 are graphs showing the real and imaginary impulse responses of this VSB filter where the values of the discrete points in time correspond to the coefficients in Table 2. FIG. 15 is a z-domain plot of the zeros produced by this VSB filter defined by the coefficients in Table 2. Note that the positions of the zeros are rotated by 45° with respect to the positions of the zeros shown in FIG. 10.

TABLE 2

| ($b_0$ through $b_{32}$) | |
| --- | --- |
| Real Part | Imaginary Part |
| 0.0000 | 0 |
| −0.0006 | −0.0006i |
| 0 | −0.0018i |
| 0.0015 | −0.0015i |
| −0.0001 | 0 |
| −0.0036 | −0.0036i |
| 0 | −0.0102i |
| 0.0072 | −0.0072i |
| 0.0000 | 0 |
| −0.0134 | −0.0134i |
| 0 | −0.0361i |
| 0.0245 | −0.0245i |
| 0.0001 | 0 |
| −0.0482 | −0.0482i |
| 0 | −0.1527i |
| 0.1576 | −0.1576i |
| 0.2501 | 0 |
| 0.1576 | +0.1576i |
| 0 | +0.1527i |
| −0.0482 | +0.0482i |
| 0.0001 | 0 |
| 0.0245 | +0.0245i |
| 0 | +0.0361i |
| −0.0134 | +0.0134i |
| 0.0000 | 0 |
| 0.0072 | +0.0072i |
| 0 | +0.0102i |
| −0.0036 | +0.0036i |
| −0.0001 | 0 |
| 0.0015 | +0.0015i |
| 0 | +0.0018i |
| −0.0006 | +0.0006i |
| 0.0000 | 0 |

The real components and the imaginary components are the weights applied to the separate arms of the VSB filter since data input to the VSB filter has only real parts.

Figure 16:
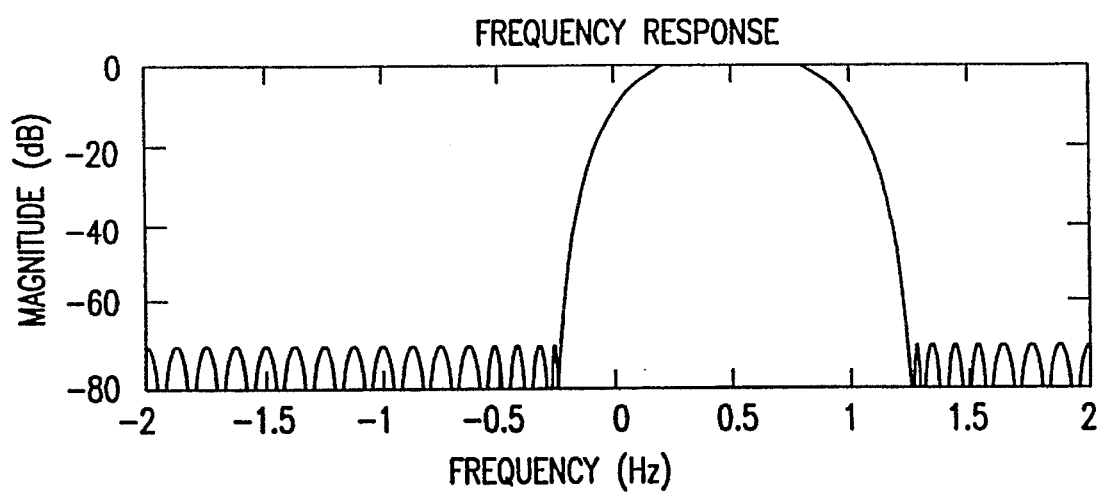
FIG. 16 is a graph showing the frequency response (log magnitude) of the VSB filter.
Figure 17:
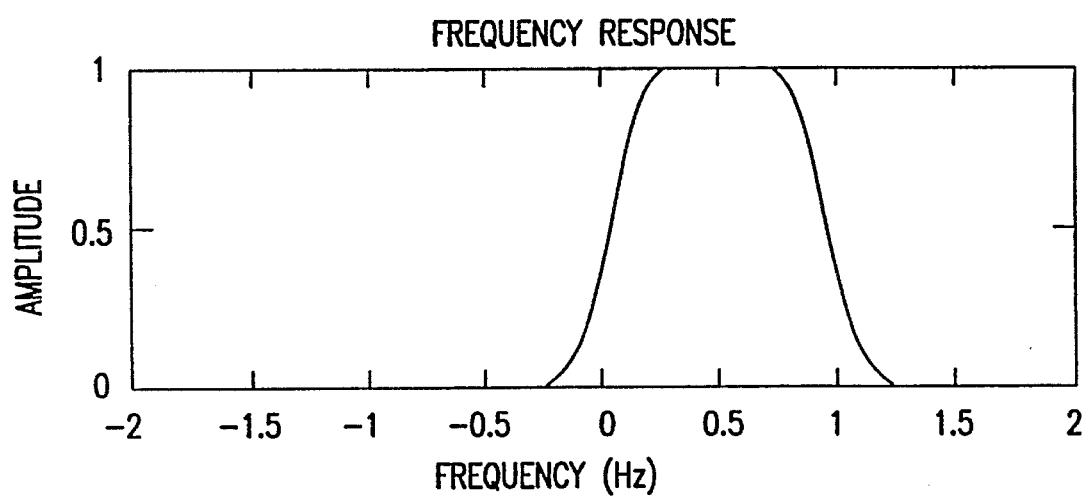
FIG. 17 is a graph showing the frequency response (linear amplitude) of the VSB filter.

The spectral power of the signal resulting from frequency response (as log magnitude) for the VSB filter (i.e., both arms) after modulation on the carrier signal is depicted in FIG. 16 (shown referenced to the carrier frequency), and the spectral power resulting from the frequency response (as linear amplitude) for the VSB filter (i.e., both arms) after modulation on the carrier signal is depicted in FIG. 17 (shown referenced to the carrier frequency).

Figure 18:
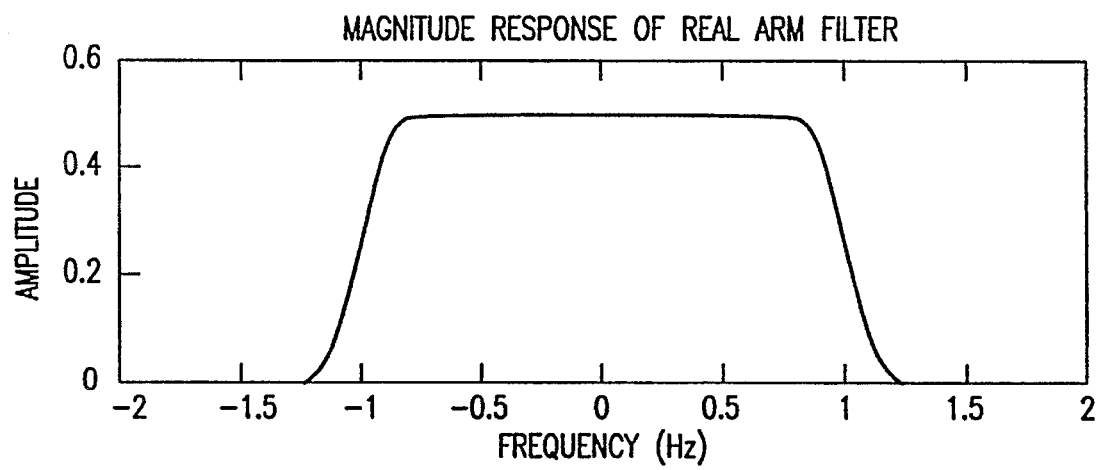
FIG. 18 is a graph showing the frequency response of the real arm of the VSB filter.
Figure 19:
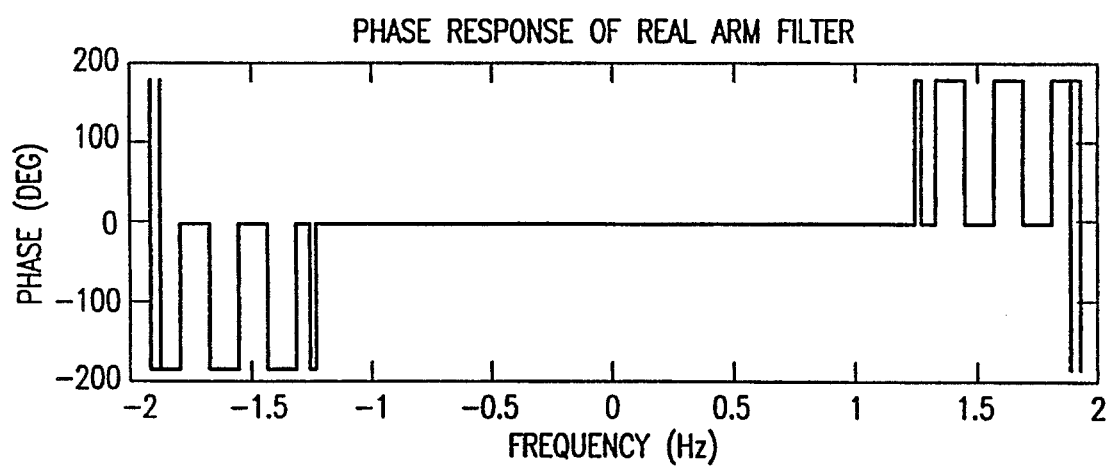
FIG. 19 is a graph showing the phase response of the real arm of the VSB filter.
Figure 20:
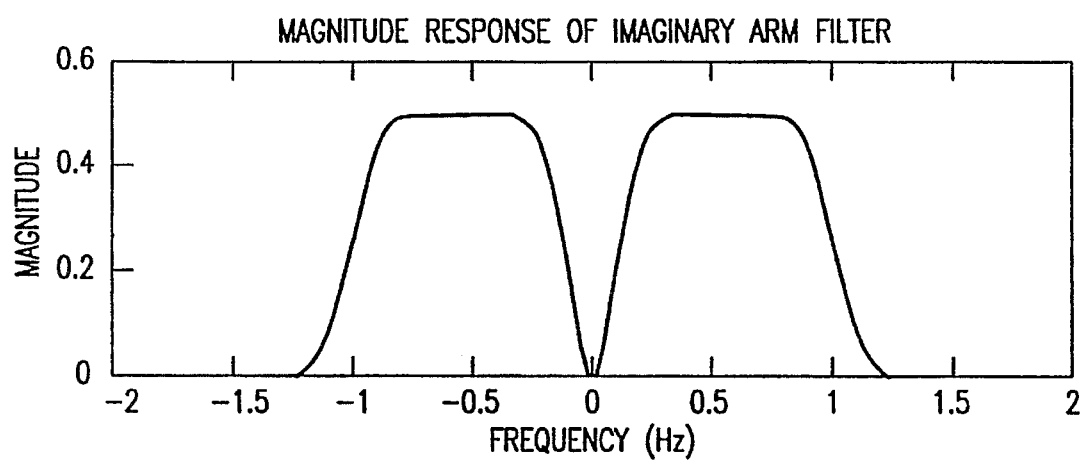
FIG. 20 is a graph showing the magnitude response of the imaginary arm of the VSB filter.

FIGS. 18 and 20 are graphs showing the frequency response (as linear amplitude) of the real and imaginary arms of the VSB filter, respectively. FIG. 19 is a graph showing the phase response of the real arm of the VSB filter. Note that the phase response of the real arm near the center frequency is zero degrees. FIG. 20 is a graph showing the frequency response of the imaginary arm of the VSB filter as having an upper portion of the spectrum (i.e., at positive frequency) and a lower portion of the spectrum (i.e., at negative frequency). The lower portion of the spectrum is phase shifted 180° with respect to the upper portion of the spectrum. When the real and imaginary arm components of the signal are added together in summing element 28, the lower portion of the spectrum tends to cancel out, and an upper vestigial sideband modulation is achieved. When the imaginary arm signal is subtracted from the real arm signal in summing circuit 28, a lower vestigial sideband modulation is achieved.

The response function of the imaginary arm filter is odd symmetric. This means that the phase at the negative frequency is 180° relative to the phase at the positive frequency.

Figure 21:
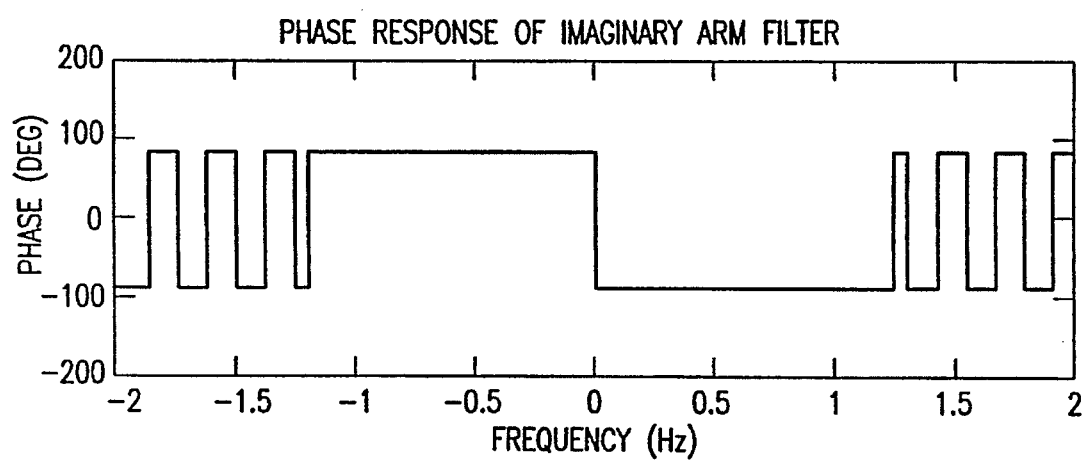
FIG. 21 is a graph showing the phase response of the imaginary arm of the VSB filter.
Figure 22:
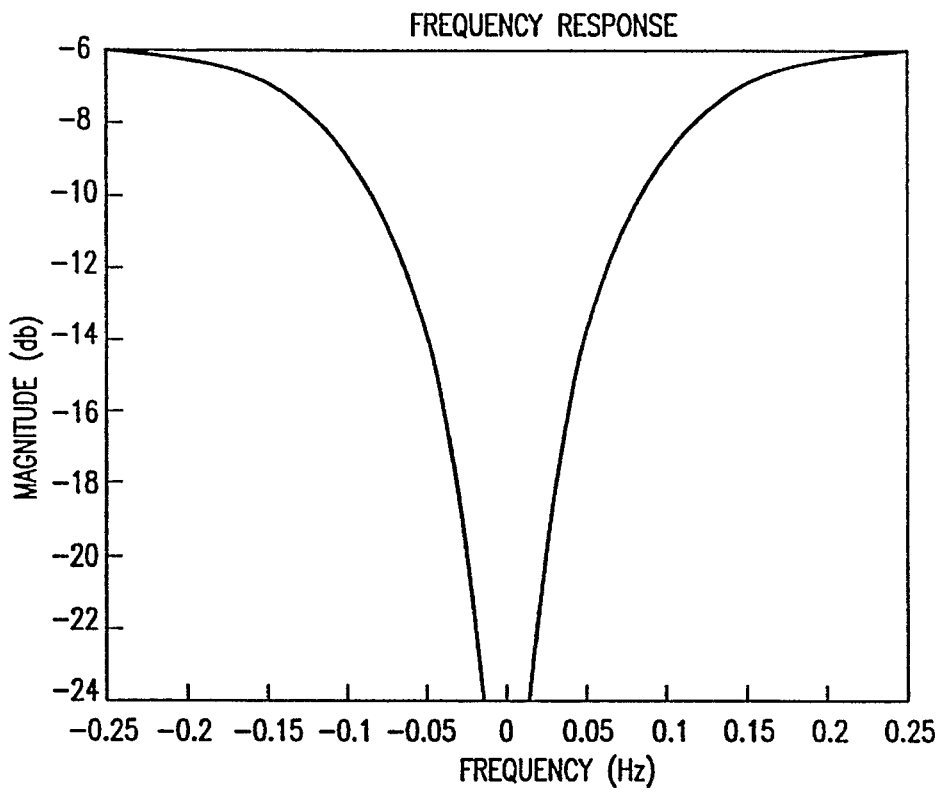
FIG. 22 is a graph showing an enlarged view of the frequency response of the graph of FIG. 20.

FIGS. 18 and 19 are graphs showing the magnitude and phase response, respectively, of the real arm of the VSB filter. FIGS. 20 and 21 are graphs showing the magnitude and phase response, respectively, to the imaginary arm of the VSB filter. Note the odd symmetric property shown in FIG. 21. FIG. 22 is a graph showing an enlarged portion of the magnitude response of the imaginary arm of the VSB filter generated at frequencies near the carrier frequency.

Figure 23:
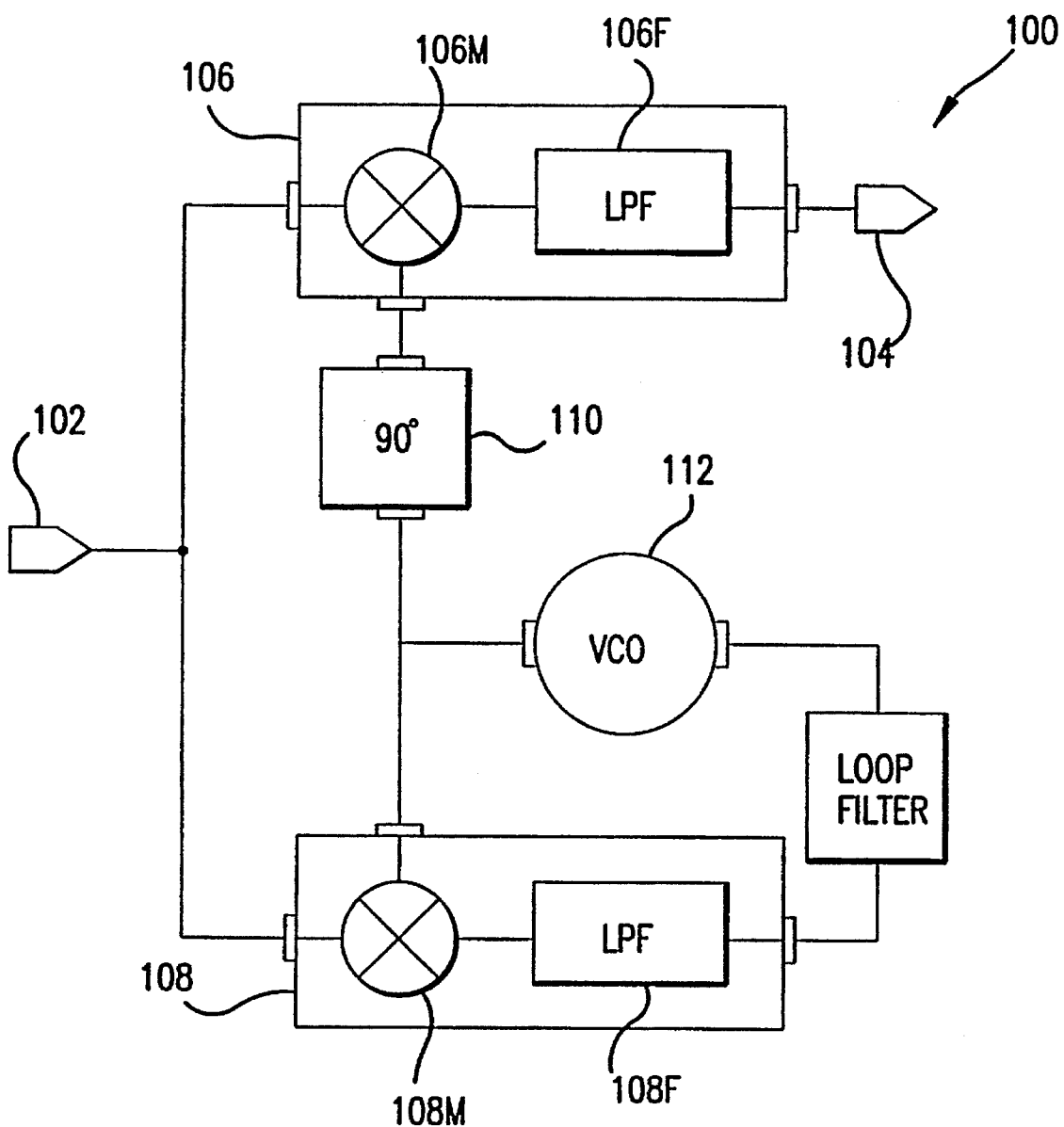
FIG. 23 is a block diagram showing a realization of a conventional synchronous detector.

FIG. 23 is a block diagram showing conventional synchronous detector 100 which uses a phase-locked loop (PLL) to regenerate the frequency of the pilot signal in the signal from a local oscillator. Conventional synchronous detector 100 has detector input terminal 102 (at which a modulated carrier signal is received) and detector output terminal 104 (at which a demodulated output signal is provided). Detector 100 includes first mixer circuit 106 and second mixer circuit 108. A first input from each of first and second mixer circuit 106, 108 is connected to detector input terminal 102. An output from first mixer circuit 106 is connected to detector output terminal 104. The conventional synchronous detector includes a phase transformer 110, sometimes referred to as a Hilbert filter, which provides a 90° phase shift from input to output. The output of phase transformer 110 is connected to a second input of first mixer circuit 106, and an input to phase transformer 110 is connected to a second input to second mixer circuit 108. The conventional synchronous detector also includes voltage-controlled oscillator 112 (VCO) having an oscillator input connected to an output of second mixer circuit 108. Voltage-controlled oscillator 112 has an output connected to an input to phase transformer 110. Each of first and second mixer circuits 106, 108 includes a mixer element 106M, 108M, respectively, and a mixer filter element 106F, 108F, respectively. Mixer filter element 106F functions only as a low pass filter of the type shown in FIG. 3. Mixer filter element 108F functions as both (1) a low pass filter of the type shown in FIG. 3, and (2) as a PLL loop filter to further limit the bandwidth of the PLL comprised of mixer circuit 108 and voltage-controlled oscillator 112.

The modulated carrier signal applied to detector input terminal 102 includes an information signal (as depicted in FIG. 1A) and a pilot signal (as depicted in 1B). The pilot signal is characterized by a discrete spectral line. The modulated carrier signal (as depicted in FIG. 1C) includes both the pilot signal and a portion of the information signal.

In operation, conventional synchronous detector 100 controls the voltage-controlled oscillator 112 to produce an output signal having a frequency substantially equal to the frequency of the pilot signal and phase approximately coherent with the phase of the pilot signal. This can only be partially achieved because the pilot signal is corrupted by information signal within the bandwidth of the phase lock loop. However, by designing mixer filter element 108F as a narrow band low pass filter so that only signals that are substantially at zero frequency (i.e., near direct current signal) control the frequency of the voltage-controlled oscillator 112, only a portion of the information signal, the portion having frequency components near the carrier frequency, is averaged to control the voltage-controlled oscillator. Alternatively, a separate loop filter may be incorporated in the PLL. As can be seen in FIG. 5, the signal density in the upper and lower sidebands at frequencies near the carrier frequency are only slightly out of balance, introducing only modest phase jitter as long as filter 108F is narrow band. However, to achieve wide band phase-locked loop tracking benefits, the bandwidth of filter 108F must be increased, thus introducing increased phase tracking jitter generating distortion into the detector output.

Figure 24:
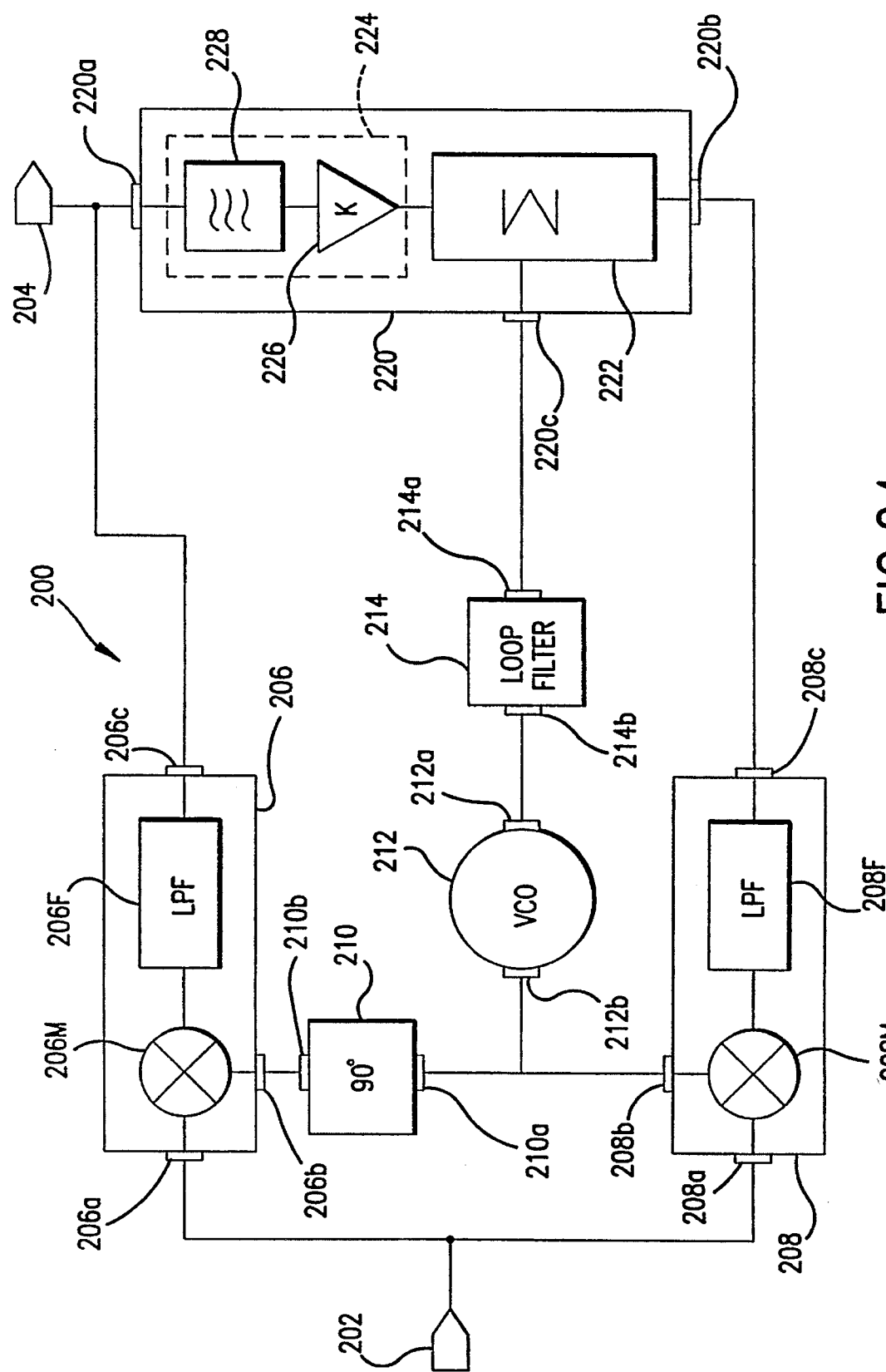
FIG. 24 is a block diagram showing a synchronous detector according to the present invention.

FIG. 24 is a block diagram showing synchronous detector 200 of the present invention. Synchronous detector 200 includes detector input terminal 202 (at which a modulated carrier signal is received) and detector output terminal 204 (at which a demodulated output signal is provided). Detector 200 includes first mixer circuit 206 and second mixer circuit 208. A first input 206a, 208a from each of first and second mixer circuits 206, 208, respectively, is connected to detector input terminal 202. First mixer output 206c from first mixer 206 is connected to detector output terminal 204. Synchronous detector 200 includes phase transformer 210, sometimes referred to as a Hilbert filter, which provides a 90° phase shift from input 210a to output 210b. The output of phase transformer 210 is connected to second input 206b of first mixer circuit 206, and input 210a to phase transformer 210 is connected to second input 208b to second mixer circuit 208. Synchronous detector 200 also includes voltage-controlled oscillator (VCO) 212 having an oscillator input 212a and oscillator output 212b, oscillator output 212b being connected to phase transformer input 210a. Each of the first and second mixer circuits 206, 208 includes a mixer element 206M, 208M, respectively, and a mixer filter element 206F, 208F, respectively. Mixer filter elements 206F, 208F function only as low pass filters of the type described with reference to FIG. 4D. There is no need to limit the bandwidth of mixer filter element 208F to define a loop bandwidth for a phase-locked loop, as is required in conventional synchronous detector 100 shown in FIG. 23.

Synchronous detector 200 includes combiner circuitry 220 which has first and second combiner inputs 220a, 220b and combiner output 220c. First combiner input 220a is connected to first mixer circuit output 206c, and second combiner input 220b is connected to second mixer circuit output 208b. Synchronous detector 200 further includes loop filter 214 having loop filter input 214a and loop filter output 214b. Combiner output 220c is connected to loop filter input 214a, and loop filter output 214b is connected to oscillator input 212a.

Combiner circuitry 220 includes jitter cancellation filter 224 and summer 222. Jitter cancellation filter 224 has an input connected to combiner input 220a and an output connected to a first input of summer 222. A second input of summer 222 is connected to second combiner input 220b. An output of summer 222 is connected to combiner output 220c.

Jitter cancellation filter 224 preferably includes high pass filter 228 and scaling circuit 226. Scaling circuit 226 might preferably be a resistor, although it may include an amplifier of transfer function K.

Figure 4D:
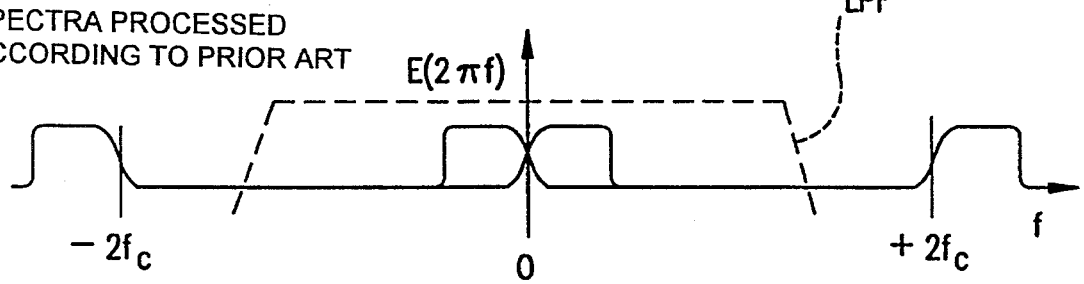

Low pass filters 206F and 208F are designed to have cutoff frequency sufficient to remove only the double carrier frequency content of the mixer output as shown in FIG. 4D. Voltage-controlled oscillator 212, mixer 208, summer 222 and loop filter 214 form a phase-locked loop (PLL). The loop bandwidth is defined by loop filter 214 according to desired noise-bandwidth tradeoffs since mixer filter element 208F does not necessarily limit signal bandwidth. Phase jitter inherent in a vestigial sideband modulated signal (or even in a single sideband signal) as received at the detector input terminal 202 is at least partially cancelled in combiner circuit 220. Because of this feature, the bandwidth of loop filter 214 need not be unnecessarily reduced in order to minimize tracking errors due to the inherent phase modulation of a vestigial sideband modulated signal.

Figure 25:
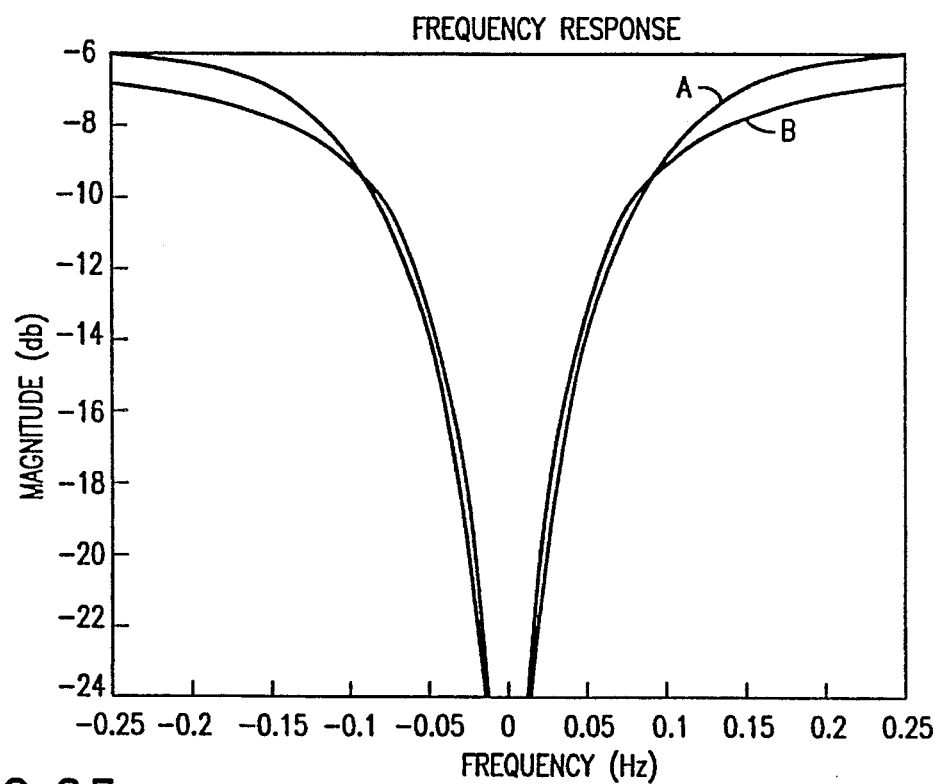
FIG. 25 is a graph showing the frequency response of the imaginary arm of the VSB filter (curve A) and superimposed thereon the frequency response of a first order Butterworth high-pass filter (curve B)
Figure 26:
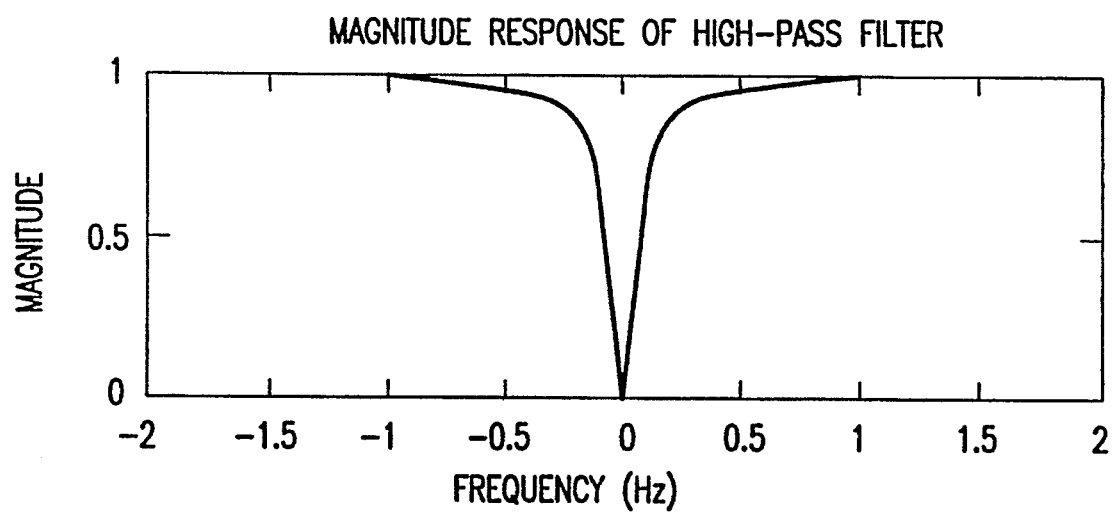
FIG. 26 is a graph showing the magnitude response of the first order Butterworth high-pass filter.
Figure 27:
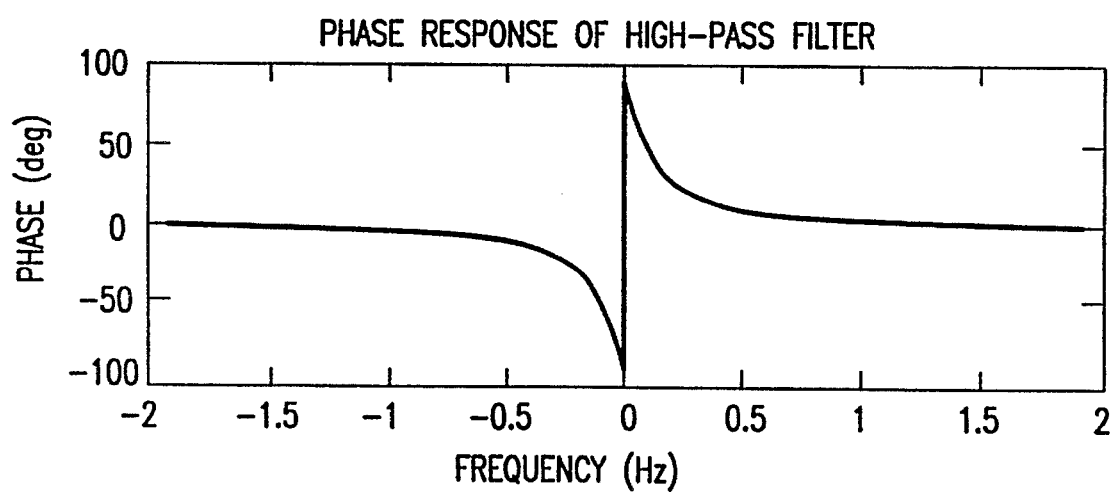
FIG. 27 is a graph showing the phase response of the first order Butterworth high-pass filter.

In operation, the signal at second mixer circuit output 208c is a replica to the signal at the output of imaginary arm 18 of the VSB filter of modulator 10 (FIG. 7). The frequency response of imaginary arm 18 (as shown in FIGS. 20 and 22) is also of the same form as shown in FIG. 25 as curve A. Superimposed on this graph (at curve B) is the frequency response of a first order Butterworth high-pass filter with a cut-off frequency of 0.1 Hz and with the gain adjusted by ½ (i.e., −6 dB) to be shown as a close match between the two response curves. FIGS. 26 and 27 are graphs showing the magnitude and phase response, respectively, of this first order Butterworth high-pass filter over a more extended frequency range. However, it should be noted that the range of interest for the synchronous detector shown in FIG. 24 is limited to the bandwidth of the loop filter. Over the bandwidth of the loop filter, jitter cancellation filter 224 is a close approximation to the frequency response shown in FIG. 20 at like frequencies. Jitter cancellation filter 224 may use any filter design so long as its frequency response is a close match to the spectral power distribution of the signal at second mixer circuit output 208c.

When VCO 212 is tuned to the carrier frequency the magnitude of the signal produced at second mixer circuit output 208c is shown by curve A in FIG. 25. The magnitude is very small for frequencies near the center frequency and larger for frequencies further distant from the center frequency. Furthermore, the phase at positive frequency differences differs from the phase at negative frequency differences by 180°.

The signal at first mixer circuit output 206c is a replica of the signal at the output of real arm 16 of the VSB filter of VSB modulator 10 (FIG. 7). The spectral power of this replica signal is of the same form as the frequency response of real arm 16 as shown in FIG. 18. This replica signal is passed through jitter cancellation filter 224. The magnitude and phase response of jitter cancellation filter 224 is shown in FIGS. 26 and 27 respectively, when the jitter cancellation filter is based on the first order Butterworth filter described above. The spectral power of the signal at the output of jitter cancellation filter 224 is shown by curve B in FIG. 25 when jitter cancellation filter 224 is based on the first order Butterworth filter described above.

Thus, the frequency response of the signal at the output of the jitter cancellation filter 224 is a close approximation for the frequency response of the signal at second mixer circuit output 208c, at least in the lower frequency region. It should be noted that the filter need not be limited to a first order Butterworth filter. Any order filter and other filter types may be used so long as FIG. 25 curves A and B are approximately matched.

Figure 28:
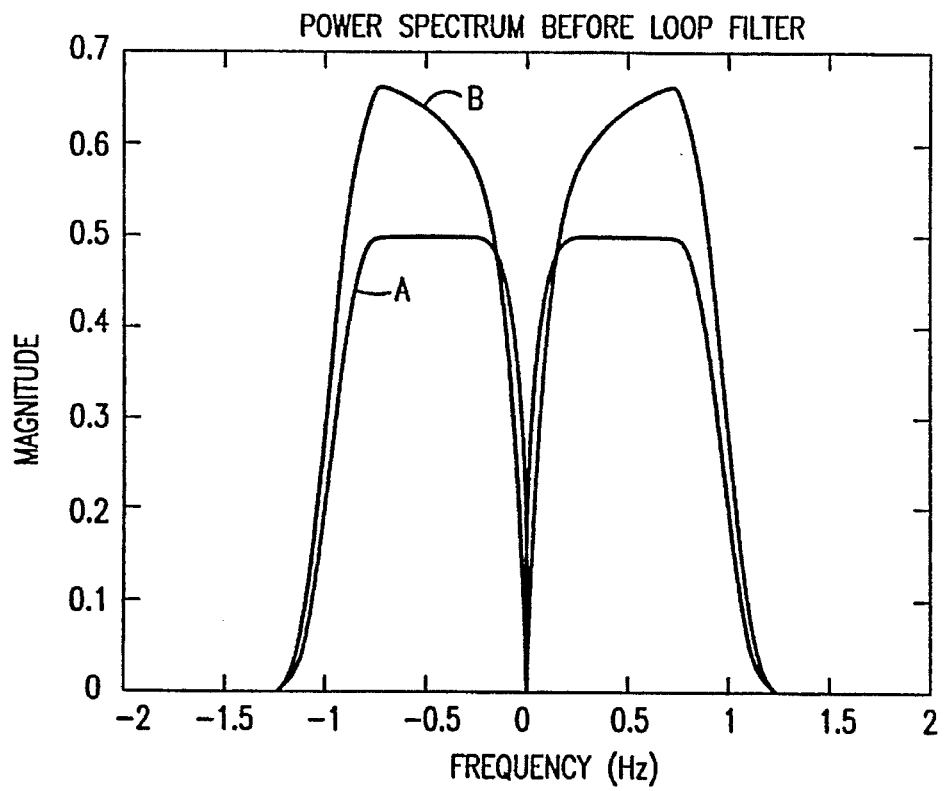
FIG. 28 is a graph showing the power spectrum at the input to loop filter 214 of FIG. 24 using a high-pass filter (curve B) and without using the high-pass filter (curve A)

Summer 222 adds the signal at the output of jitter cancellation filter 224 to the signal provided at second mixer circuit output 208c. The power spectrum of the resulting output signal of summer 222 is shown as curve B in FIG. 28. Curve A of FIG. 28 shows the output signal power spectrum with jitter cancellation filter disconnected (i.e., gain equal to zero). Curve A, therefore, corresponds to the frequency response shown in FIG. 20.

However, curve B is more subtle. The magnitude and phase of the signal input to jitter cancellation filter 224 corresponds to the response curves shown in FIGS. 18 and 19, respectively. The phase near the center frequency is zero. Such a signal is then filtered in jitter cancellation filter 224 having magnitude and phase responses shown in FIGS. 26 and 27, respectively. At frequencies far displaced from the center frequency, the phase of the signal at the output of jitter cancellation filter is still zero. In contrast, the phase of the signal (curve A, FIG. 28) at second mixer circuit output 208c is either plus or minus 90° at frequencies displaced from the center frequency. This is shown in FIGS. 20 and 21 for the signal at the output of imaginary arm 18 of the VSB filter which corresponds to the signal output from second mixer circuit output 208c. Thus, there is a 90° phase difference between the signal at the output of jitter cancellation filter 224 and the signal at second mixer circuit output 208c at frequencies far displaced from the center frequency. Since this 90° phase difference prevents signal cancellation, the magnitude of curve B (FIG. 28) remains large at frequencies far displaced from the center frequency.

In contrast, at frequencies near the center frequency, the phase of the signal at the output of jitter cancellation filter 224 corresponds to the phase response of the high-pass filter as shown in FIG. 27. At slightly positive frequencies, there is a plus 90° phase shift, and at slightly negative frequencies, there is a minus 90° phase shift. The phase of the signal at second mixer circuit output 208c corresponds to the phase response of the imaginary arm of the VSB filter as shown in FIG. 21. At slightly positive frequencies, there is a minus 90° phase shift and at slightly minus frequencies, there is a plus 90° phase shift. At frequencies near the center frequency, summer 222 cancels the two input signals by adding two equal magnitude signals, one having a plus 90° phase shift and the other having a minus 90° phase shift. Thus, phase jitter inherent in a VSB signal is cancelled in combiner circuitry 220. However, true phase offsets in the VCO signal with respect to the phase of the carrier signal in the modulator are detected in second mixer circuit 208 and passed through the loop filter to adjust the VCO phase.

Figure 29:
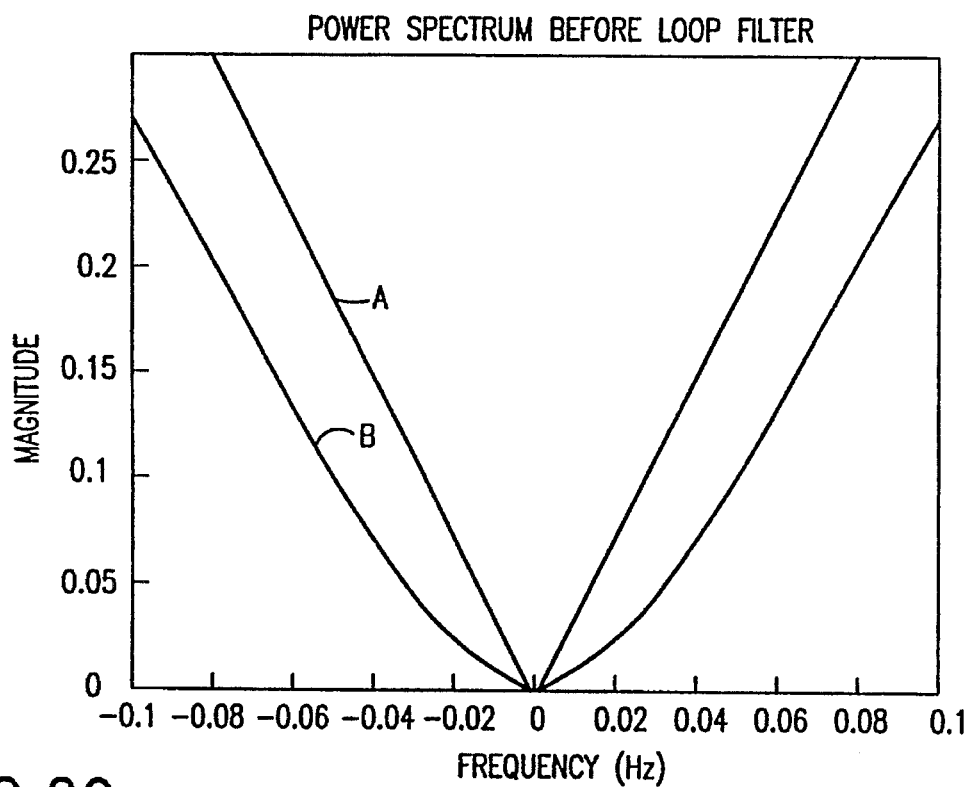
FIG. 29 is a graph showing an enlarged view of FIG. 28.

FIG. 28 is a graph showing the power spectrum of the signal at the input to the loop filter. Depicted at curve B is the power spectrum using the first order Butterworth high-pass filter with gain set to unity. Depicted at curve A is the power spectrum at the input to the loop filter with the high pass filter disconnected (gain set to zero). FIG. 29 is a graph showing an enlarged portion of FIG. 20. Note particularly that close to the carrier frequency, the noise density in the power spectrum is reduced by using the high-pass filter design shown in FIG. 24 as compared to old art without combiner circuitry 220, thus reducing phase jitter.

Figure 30:
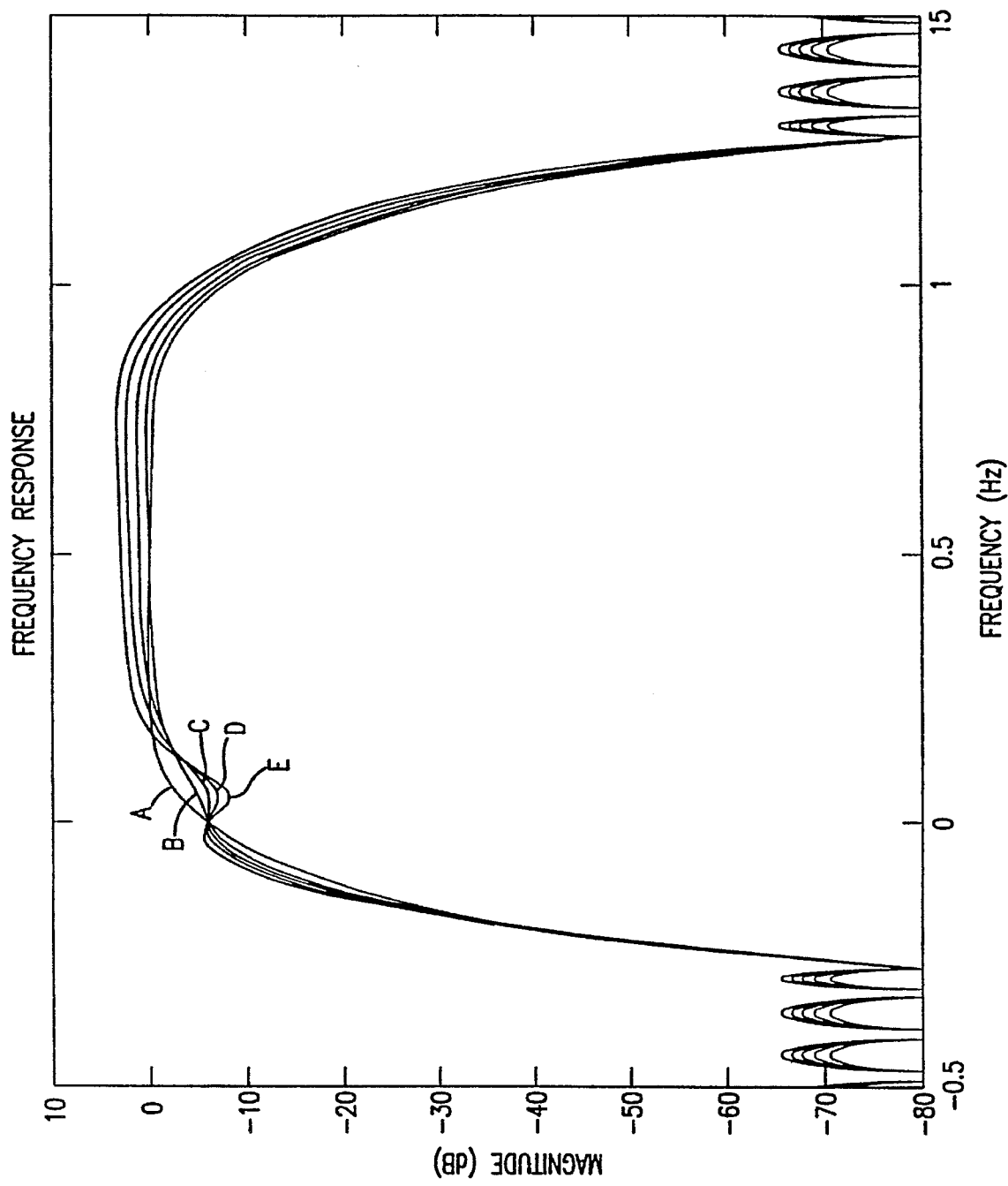
FIG. 30 is a graph showing the equivalent spectrum seen by the modified pilot tracking circuitry. (This spectrum is not present in the modulator or demodulator.)
Figure 31:
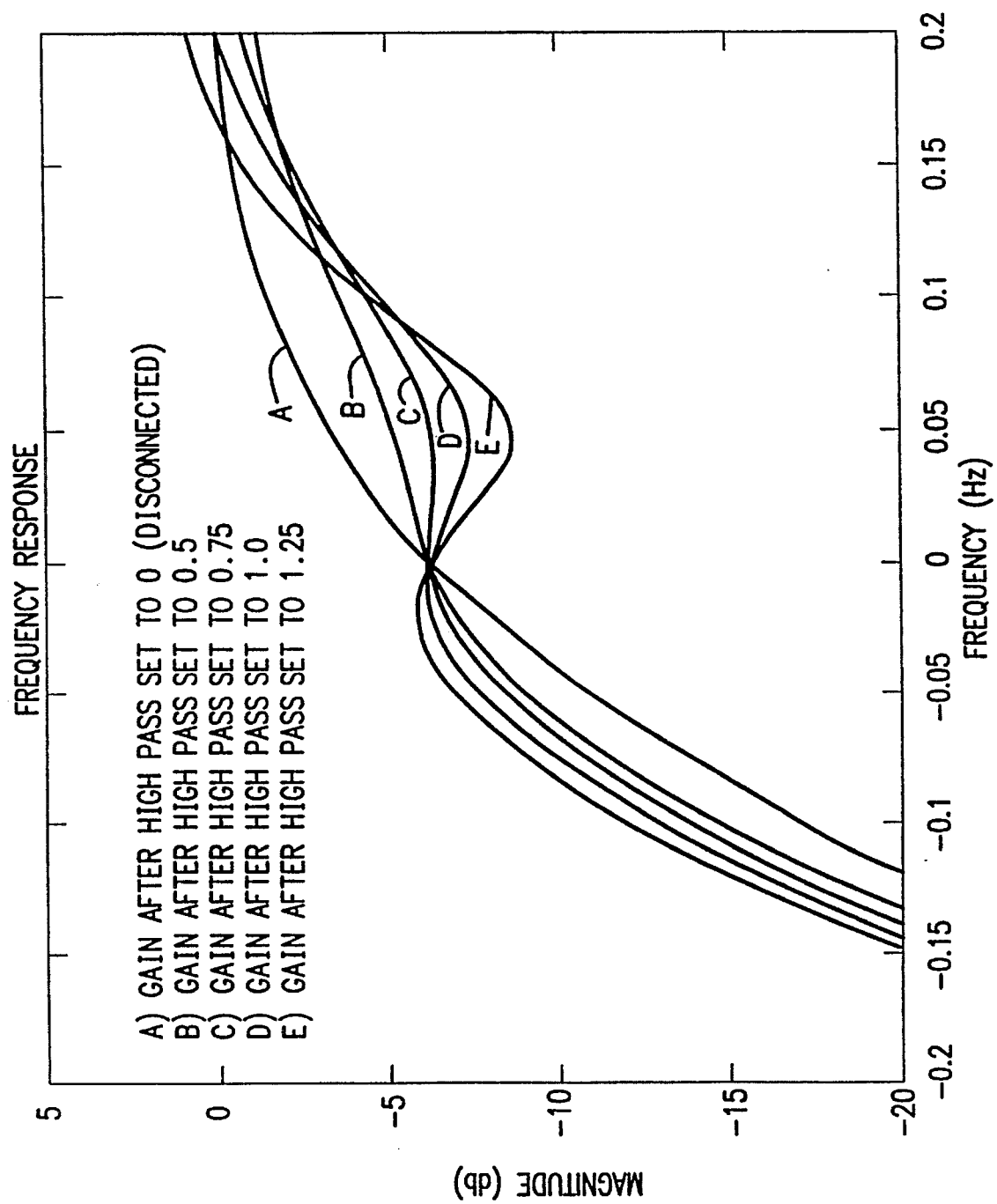
FIG. 31 is a graph showing an enlarged view of the graph shown in FIG. 30.

FIGS. 30 and 31 illustrate the effect of the transmission system. If combiner circuitry 220 were connected into the modulator (FIG. 7) so that the output of real arm 16 was connected to the input of jitter cancellation filter 224 (i.e., combiner circuit first input 220a), and the output of imaginary arm 18 was disconnected from mixer 24 and connected to second combiner circuitry input 220b instead, and combiner circuitry output 220c were connected to mixer 24 in place of the output from imaginary arm 18, the spectral power of the signal at output terminal 14 would be as is shown in FIGS. 30 and 31. FIG. 30 shows the equivalent spectral power (as log magnitude) of the vestigial sideband modulated signal referenced to baseband when the characteristics of the first order Butterworth filter are used in the combiner circuitry 220. Curves A–E correspond to jitter cancellation filter gains of 0, 1.5, 0.75, 1.0, and 1.25, respectively. FIG. 31 is a graph showing an enlarged portion of the frequency response curve near the carrier frequency. In order to minimize phase jitter, it is desirable that the frequency response near the carrier frequency be as flat as possible (e.g., curve C in FIG. 31) to counter the effects causing phase jitter as discussed with reference to FIGS. 6A–6D.

Therefore, jitter cancellation filter 224 in conjunction with summer 222 in combiner circuitry 220 are capable of cancelling the phase jitter inherent in vestigial sideband and other signals at frequencies near the carrier frequency on the transmitter side as well as the receiver side. This feature permits the bandwidth of the loop filter to be made wider while still maintaining a specified phase tracking accuracy. It will be appreciated that the phase tracking accuracy provided by the synchronous detector shown in FIG. 24 may be improved compared to old art when maintaining a specified bandwidth for the loop bandwidth filter which may be a requirement due for other system constraints.

Figure 32A:
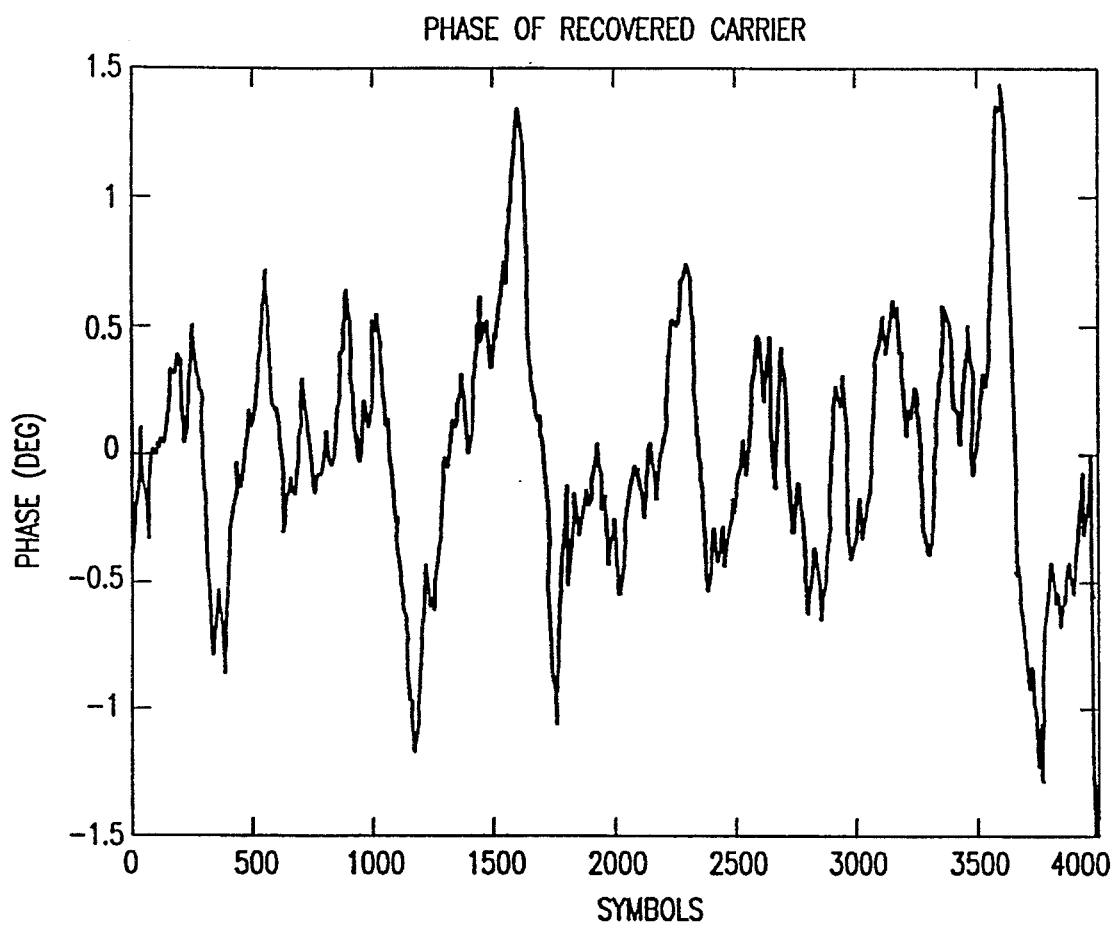
FIGS. 32A–32D are graphs and histograms showing phase tracking results of a simulation of the synchronous detector.
Figure 32B:
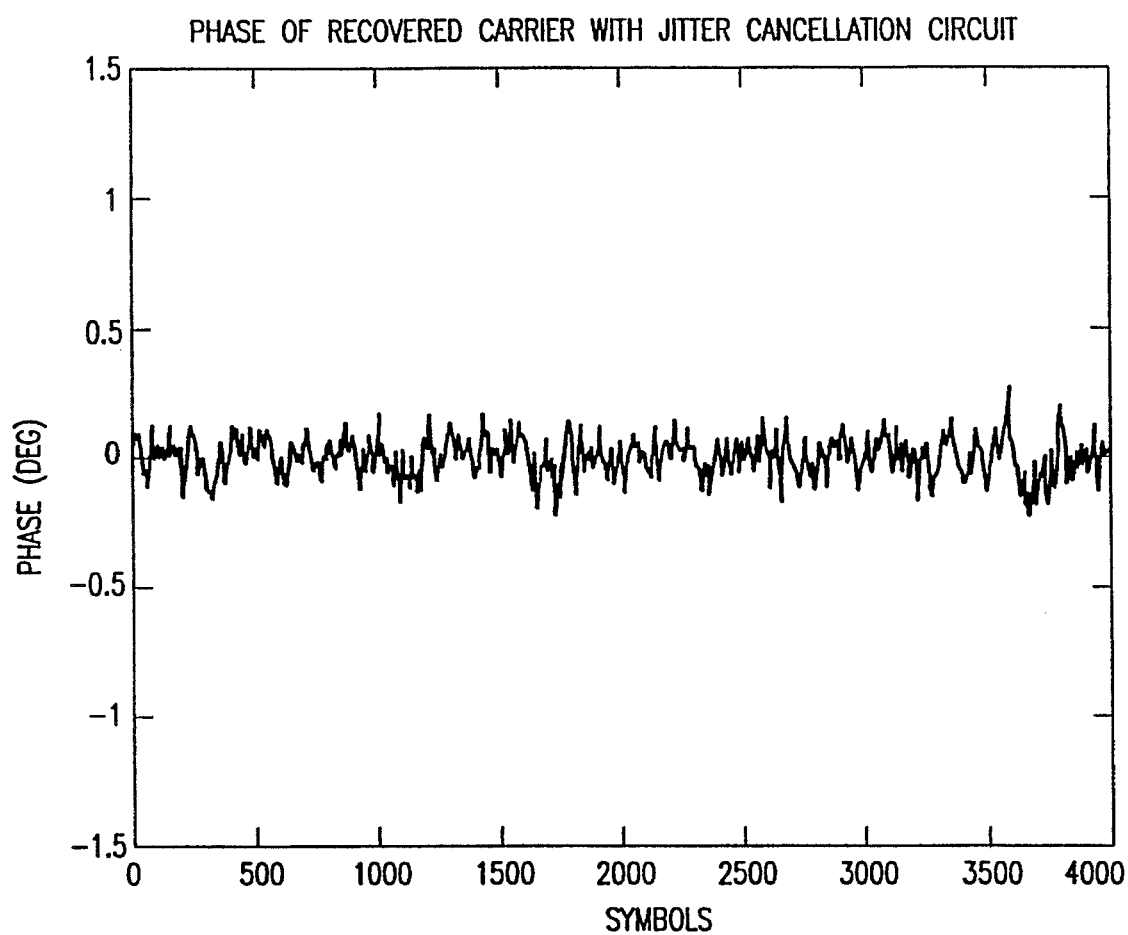
Figure 32C:
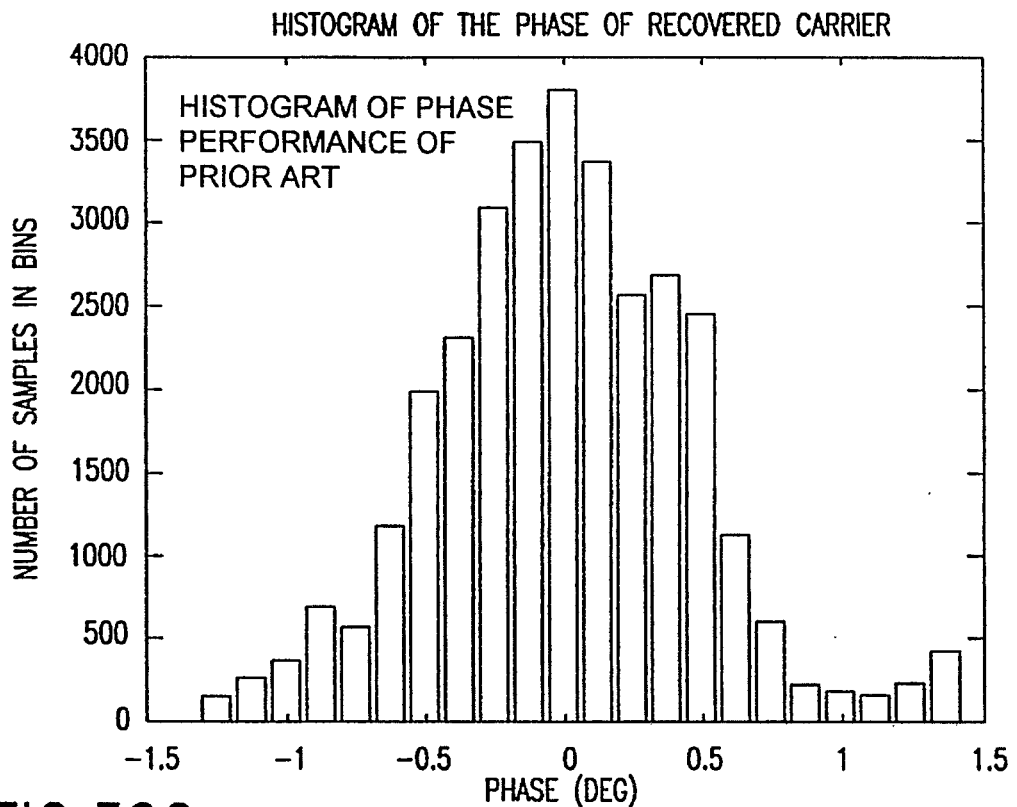
Figure 32D:
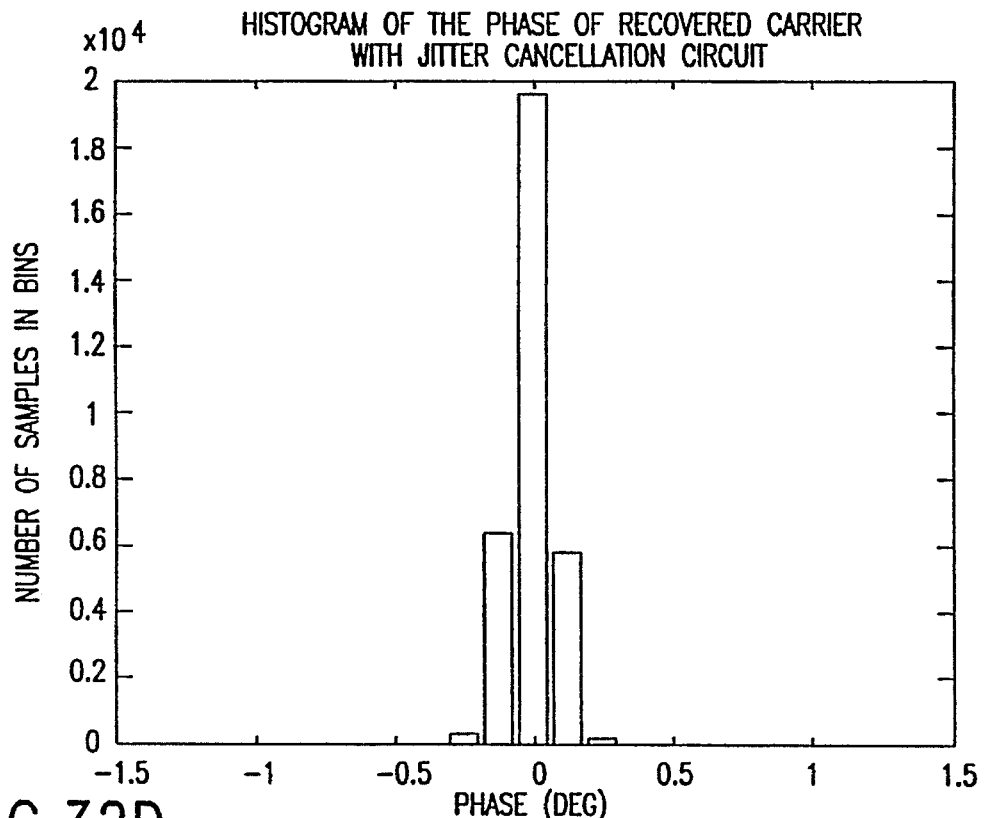

The performance of the synchronous detectors shown in FIGS. 23 and 24 were simulated on a computer for a 21.5 Mbit/sec. data stream in a 4-VSB format. FIGS. 32A–32D, are graphs and histograms showing the simulation results for carrier recovery of 4,000 simulated symbols. The vertical scale of FIGS. 32A and 32B shows the phase of the recovered carrier of loop filter 214 (designed as a 13.4 kHz, and N=2 low pass filter). FIG. 32A corresponds to the conventional synchronous detector where the loop filter output, when converted into degrees, varies between −1.2877 and +1.4572 degrees. The cancellation was approximated by a high pass filter with a cut off frequency of 312.5 kHz with a mean and standard deviation of 0.0003 and 0.4629 degrees. FIG. 32B shows the loop filter output with a jitter cancellation filter (designed as the 312.5 kHz high pass filter). The excess filter bandwidth (i.e., the alpha factor) is, in this example, 12%. The loop filter output, when converted into degrees, varies from a −0.2420 to +0.2873 degrees with a mean and standard deviation of 0.0021 and 0.0735. Thus, synchronous detector 200 shown in FIG. 24 reduces peak-to-peak phase litter as compared to conventional synchronous detector 100 by a factor of more than 6 to 1 (see FIGS. 32C and 32D for histograms of the phase of the recovered carrier). In practical receiver systems, the improvement enables reliable reception of signals with less distortion (e.g., distortion known in the television arts as quadrature distortion). A different filter design which would result in a closer match between curves A and B in FIG. 25 would further improve performance. More complicated, and therefore more expensive, filter designs may provide better performance but might increase the cost and complexity of the synchronous detector. It is left to the designer to select the filter design for the jitter cancellation filter which provides the best phase tracking performance consistent with the design constraints of cost, complexity and other constraints imposed by the particular technology being used in the synchronous detector (e.g., digital vs. analog circuits, bipolar vs. MOS transistors, etc.).

Figure 33:
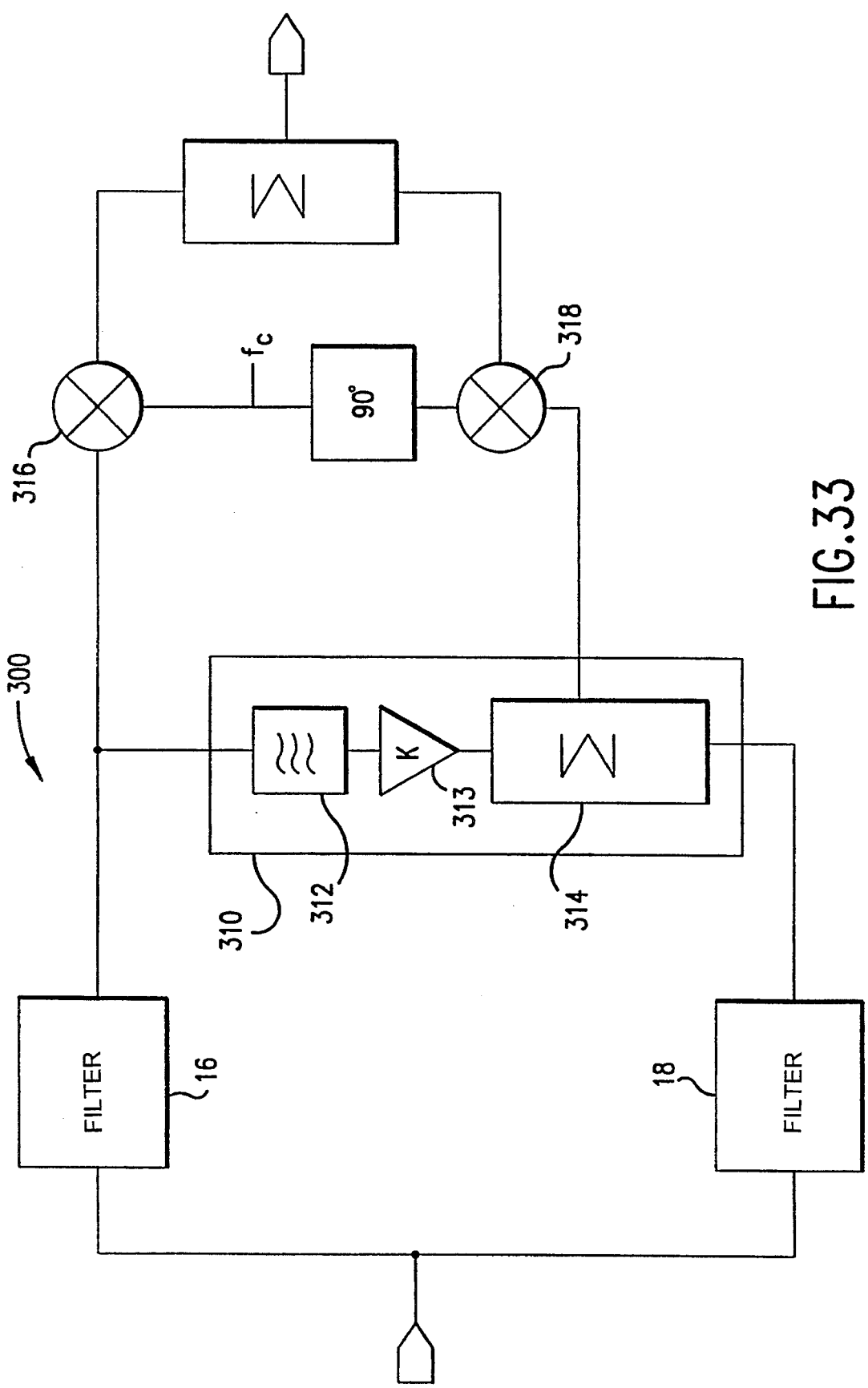
FIG. 33 is a modulator of a transmitter incorporating a cancellation filter according to the present invention.

In FIG. 33 modulator 300 includes real and imaginary arm filters 16 and 18 and transmitter cancellation circuit 310.

Transmitter cancellation circuit 310 corresponding to combiner circuitry 220 (FIG. 24) includes high pass (or band pass) filter 312, amplitude sending circuit 313, and summer 314. The output of summer 314 provides the signal input to second mixer 318 and real arm 16 provides the corresponding signal input to first mixer 316. Modulator 300 may substitute for the modulator depicted in FIG. 7 to control the shape of the spectrum as discussed with reference to FIGS. 30 and 31.

Having described preferred embodiments of a novel synchronous detector and method for synchronous detection, which are intended to be illustrative and not limiting, it is noted that modifications and variations can be made by those skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is desired to be protected by Letters Patent is set forth in the following claims.

What is claimed is:

1. A modulator for shaping a spectrum of a modulated signal produced by modulating an information signal on a carrier signal, the modulator comprising:

first and second input filters, each filter coupled to the information signal, the first input filter having a first filter output, the second filter having a second filter output;

combiner circuitry having first and second combiner inputs and a combiner output, the first combiner input being coupled to the first filter output, the second combiner input being coupled to the second filter output, the combiner circuitry including a summer and a filter circuit, the filter circuit having an input connected to the first combiner input, the summer having a first summer input coupled to an output of the filter circuit, the summer having a second summer input connected to the second combiner input, and the summer having a summer output connected to the combiner output;

first and second mixer circuits, each mixer circuit having first and second mixer inputs and a mixer output, the first mixer input of the first mixer circuit being coupled to the first filter output, the combiner output being coupled to the first mixer input of the second mixer circuit;

a phase transformer having a transformer input coupled to the second mixer input of the first mixer circuit and having a transformer output coupled to the second mixer input of the second mixer circuit;

a carrier signal input terminal connected to the transformer input; and summation circuitry having a first summation circuitry input, a second summation circuitry input and a summation circuitry output, the first summation circuitry input being coupled to the mixer output of the first mixer circuit, the second summation circuitry input being coupled to the mixer output of the second mixer circuit, the summation circuitry output providing the modulated signal.

2. The modulator of claim 1, wherein the filter circuit of the combiner circuitry includes one of a high pass filter and a bandpass filter.

3. The modulator of claim 1, wherein:

a signal at the second filter output is characterized by a second filter output signal slope, the second filter output signal slope being defined by a change in signal density per unit frequency at frequencies within a predetermined bandwidth about a frequency of the carrier signal applied to the carrier signal input terminal; and the filter circuit of the combiner circuitry is characterized by a transfer function slope, the transfer function slope being defined by a change i transfer function spectral density per unit frequency at the frequencies within the predetermined bandwidth about the frequency of the carrier signal, the transfer function slope being substantially equal to the second filter output signal slope.

4. The modulator of claim 1, wherein:

the filter circuit of the combiner circuitry provides a filter circuit signal; and the second input filter provides a second filtered signal, the second filtered signal being substantially out of phase with the filter circuit signal at frequencies within a predetermined bandwidth about a frequency of the carrier signal applied to the carrier signal input terminal.

5. The modulator of claim 4, wherein the filter circuit signal at least partially cancels the second filtered signal in the signal produced at the summer output at the frequencies within the predetermined bandwidth about the frequency of the carrier signal.

6. The modulator of claim 1, wherein:

the first and second input filters provide respective first and second filtered signals;

the first filtered signal is further filtered in the filter circuit of the combiner circuitry before it is processed by the summer; and the second filtered signal is not further filtered before it is processed in the summer.

7. The modulator of claim 1, wherein the first and second input filters are characterized by respective transfer functions so that the modulated signal at the summation circuitry output is a vestigial sideband modulated signal.

8. The modulator of claim 1, wherein the filter circuit includes a first order Butterworth high pass filter.

9. A modulator for shaping a spectrum of a modulated signal produced by modulating an information signal on a carrier signal, the modulator comprising:

first and second input filters, each filter coupled to the information signal, the first input filter having a first filter output, the second filter having a second filter output;

combiner circuitry having first and second combiner inputs and a combiner output, the first combiner input being coupled to the first filter output, the second combiner input being coupled to the second filter output;

first and second mixer circuits, each mixer circuit having first and second mixer inputs and a mixer output, the first mixer input of the first mixer circuit being coupled to the first filter output, the combiner output being coupled to the first mixer input of the second mixer circuit;

a phase transformer having a transformer input coupled to the second mixer input of the first mixer circuit and having a transformer output coupled to the second mixer input of the second mixer circuit;

a carrier signal input terminal connected to the transformer input; and summation circuitry input and a summation circuitry output, a second summation circuitry input and a summation circuitry output, the first summation circuitry input being coupled to the mixer output of the first mixer circuit, the second summation circuitry input being coupled to the mixer output of the second mixer circuit, the summation circuitry output providing the modulated signal.

10. The modulator of claim 9, wherein:

the first and second input filters provide respective first and second filtered signals; and the combiner circuitry combines the first and second filtered signals so that the first filtered signal at least partially cancels the second filtered signal in a signal produced at the combiner output at frequencies within a predetermined bandwidth about a frequency of the carrier signal applied to the carrier signal input terminal.

11. The modulator of claim 10, wherein the combiner circuitry alters a phase of the first filtered signal to produce an altered phase signal, the altered phase signal being substantially out of phase with the second filtered signal at the frequencies within the predetermined bandwidth about the frequency of the carrier signal, the summation of the altered phase signal and the second filtered signal producing the signal provided at the combiner output.

12. The modulator of claim 9, wherein the first and second input filters are characterized by respective transfer functions so that the modulated signal at the summation circuitry output is a vestigial sideband modulated signal.

* * * * *